United States Patent
Tanaka et al.

(10) Patent No.: US 9,143,747 B2
(45) Date of Patent: Sep. 22, 2015

(54) COLOR IMAGING ELEMENT AND IMAGING DEVICE

(71) Applicant: FUJIFILM Corporation, Tokyo (JP)

(72) Inventors: Seiji Tanaka, Saitama (JP); Kenkichi Hayashi, Saitama (JP); Noriko Kawamura, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/589,572

(22) Filed: Jan. 5, 2015

(65) Prior Publication Data

US 2015/0116554 A1 Apr. 30, 2015

Related U.S. Application Data

(63) Continuation of application No. PCT/JP2013/068230, filed on Jul. 3, 2013.

(30) Foreign Application Priority Data

Jul. 6, 2012 (JP) .................. 2012-152676

(51) Int. Cl.
*H04N 9/04* (2006.01)
*H04N 9/07* (2006.01)
*H01L 27/146* (2006.01)

(52) U.S. Cl.
CPC .......... *H04N 9/045* (2013.01); *H01L 27/14621* (2013.01); *H04N 9/07* (2013.01)

(58) Field of Classification Search
CPC ................................ H01L 27/14621
See application file for complete search history.

(56) References Cited

U.S. PATENT DOCUMENTS

| 3,971,065 | A | * | 7/1976 | Bayer | 348/276 |
| 5,251,019 | A | | 10/1993 | Moorman et al. | |
| 5,889,554 | A | | 3/1999 | Mutze | |
| 6,819,359 | B1 | * | 11/2004 | Oda | 348/247 |
| 6,995,796 | B2 | * | 2/2006 | Taubman | 348/280 |

(Continued)

FOREIGN PATENT DOCUMENTS

| EP | 1793620 A1 | 6/2007 |
| JP | 58-219889 A | 12/1983 |

(Continued)

OTHER PUBLICATIONS

International Search Report, mailed Sep. 10, 2013, issued in PCT/JP2013/068230.

(Continued)

*Primary Examiner* — Michael Osinski
(74) *Attorney, Agent, or Firm* — Birch, Stewart, Kolasch & Birch, LLP

(57) ABSTRACT

In the color imaging element and the imaging device according to an aspect of the present invention, a basic array pattern is repeatedly placed in a first direction and in a second direction, the basic array pattern includes four or more rectangular patterns each corresponding to 3×2 pixels each composed of a first filter, a color filter array includes therein grating filter lines surrounding the four directions of the rectangular pattern, the color filter array includes therein the first filters each disposed in each line in the first direction, in the second direction, in a third direction, and in a fourth direction, and the basic array pattern includes therein one or more second filters of each color, each disposed in each line in the first direction in the second direction.

19 Claims, 15 Drawing Sheets

(56) References Cited

U.S. PATENT DOCUMENTS

| | | | |
|---|---|---|---|
| 8,456,553 B2* | 6/2013 | Hayashi et al. | 348/273 |
| 8,599,291 B2* | 12/2013 | Min et al. | 348/280 |
| 8,723,991 B2* | 5/2014 | Kawamura et al. | 348/266 |
| 8,743,246 B2* | 6/2014 | Hayashi et al. | 348/272 |
| 8,780,239 B2* | 7/2014 | Yamashita | 348/280 |
| 8,804,015 B2* | 8/2014 | Hayashi et al. | 348/273 |
| 8,810,697 B2* | 8/2014 | Kawai | 348/290 |
| 8,878,970 B2* | 11/2014 | Tanaka | 348/273 |
| 8,922,683 B2* | 12/2014 | Hayashi et al. | 348/275 |
| 8,964,087 B2* | 2/2015 | Kurahashi et al. | 348/308 |
| 8,982,253 B2* | 3/2015 | Kawai et al. | 348/272 |
| 2002/0149686 A1* | 10/2002 | Taubman | 348/272 |
| 2003/0020819 A1* | 1/2003 | Fukuda | 348/246 |
| 2006/0203113 A1* | 9/2006 | Wada et al. | 348/302 |
| 2007/0127040 A1* | 6/2007 | Davidovici | 356/629 |
| 2007/0153104 A1* | 7/2007 | Ellis-Monaghan et al. | 348/272 |
| 2008/0012969 A1* | 1/2008 | Kasai et al. | 348/266 |
| 2008/0122946 A1* | 5/2008 | Sung et al. | 348/224.1 |
| 2008/0151083 A1* | 6/2008 | Hains et al. | 348/273 |
| 2009/0021629 A1* | 1/2009 | Yamada | 348/311 |
| 2009/0200451 A1 | 8/2009 | Conners | |
| 2010/0157091 A1* | 6/2010 | Honda et al. | 348/223.1 |
| 2011/0019041 A1* | 1/2011 | Ishiwata et al. | 348/280 |
| 2012/0293696 A1* | 11/2012 | Tanaka | 348/280 |
| 2013/0048833 A1* | 2/2013 | Hayashi et al. | 250/208.1 |
| 2013/0193311 A1* | 8/2013 | Yoshida | 250/208.1 |
| 2014/0307131 A1* | 10/2014 | Tanaka et al. | 348/273 |
| 2014/0307133 A1* | 10/2014 | Kawai et al. | 348/273 |
| 2014/0307135 A1* | 10/2014 | Tanaka et al. | 348/280 |
| 2014/0307140 A1* | 10/2014 | Hayashi et al. | 348/281 |
| 2014/0307141 A1* | 10/2014 | Tanaka et al. | 348/281 |
| 2014/0313350 A1* | 10/2014 | Keelan | 348/188 |
| 2015/0029367 A1* | 1/2015 | Tanaka | 348/280 |
| 2015/0070528 A1* | 3/2015 | Kikuchi | 348/224.1 |
| 2015/0070551 A1* | 3/2015 | Kawai et al. | 348/303 |
| 2015/0077597 A1* | 3/2015 | Furuta | 348/242 |
| 2015/0098499 A1* | 4/2015 | Tominaga | 375/240.02 |
| 2015/0109491 A1* | 4/2015 | Hayashi et al. | 348/273 |
| 2015/0109492 A1* | 4/2015 | Hayashi et al. | 348/277 |
| 2015/0109493 A1* | 4/2015 | Hayashi et al. | 348/277 |
| 2015/0109494 A1* | 4/2015 | Tanaka et al. | 348/277 |
| 2015/0109495 A1* | 4/2015 | Tanaka et al. | 348/277 |
| 2015/0109497 A1* | 4/2015 | Tanaka et al. | 348/280 |
| 2015/0109498 A1* | 4/2015 | Aoki et al. | 348/280 |
| 2015/0116554 A1* | 4/2015 | Tanaka et al. | 348/277 |
| 2015/0116555 A1* | 4/2015 | Hayashi et al. | 348/280 |
| 2015/0117832 A1* | 4/2015 | Aoki et al. | 386/224 |

FOREIGN PATENT DOCUMENTS

| | | |
|---|---|---|
| JP | 2-210996 A | 8/1990 |
| JP | 5-505718 A | 8/1993 |
| JP | 8-23543 A | 1/1996 |
| JP | 11-285012 A | 10/1999 |
| JP | 2000-308080 A | 11/2000 |
| JP | 2001-85664 A | 3/2001 |
| JP | 2005-136766 A | 5/2005 |

OTHER PUBLICATIONS

Written Opinion of the International Searching Authority, mailed Sep. 10, 2013, issued in PCT/JP2013/068230.

Extended European Search Report dated Aug. 4, 2014, for European Application No. 11859479.5.

Extended European Search Report dated Jan. 27, 2015, for European Application No. 12804973.1.

Extended European Search Report dated Oct. 28, 2014, for European Application No. 11859950.5.

Hirakawa et al., "Spatio-Spectral Color Filter Array Design for Optimal Image Recovery", IEEE Transactions on Image Processing, vol. 17, No. 10, Oct. 2008, pp. 1876-1890.

* cited by examiner 12 (COLOR IMAGING ELEMENT)

VERTICAL DIRECTION (V)

HORIZONTAL DIRECTION (H)

FIG.12
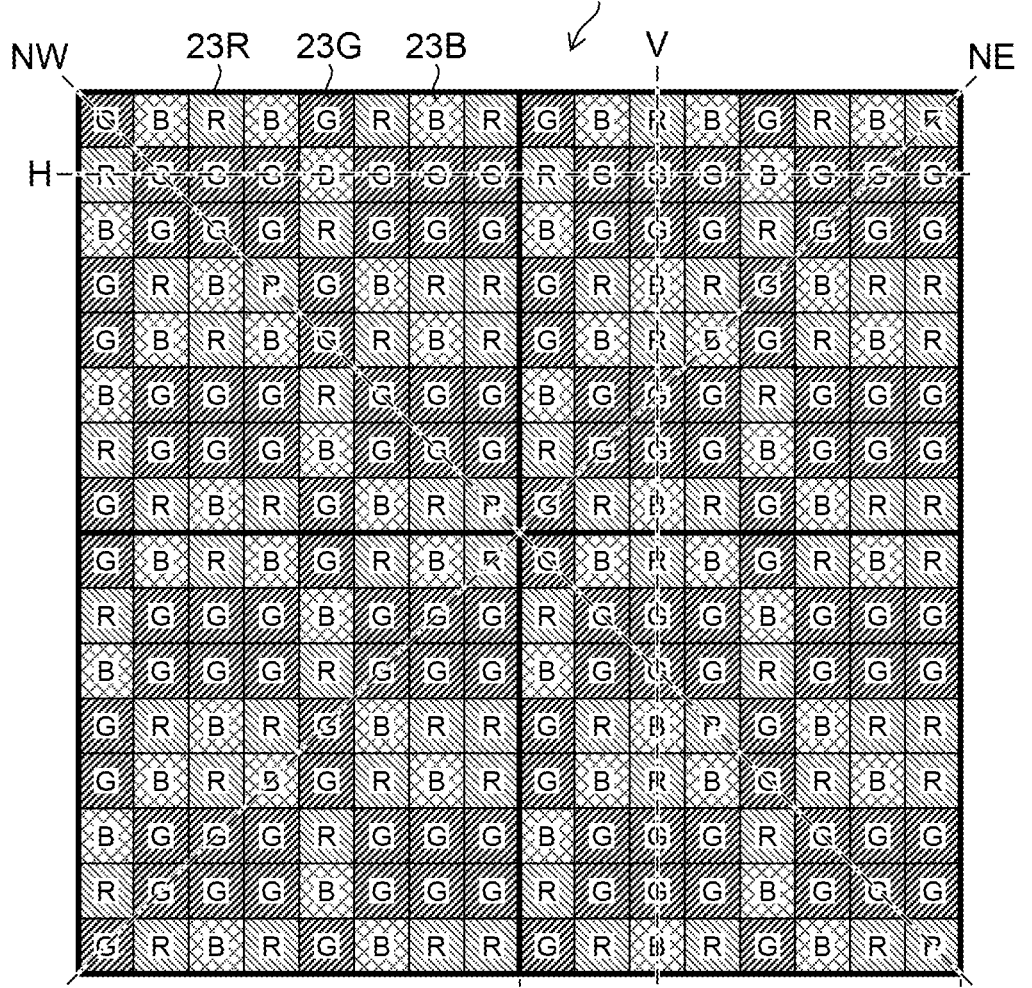
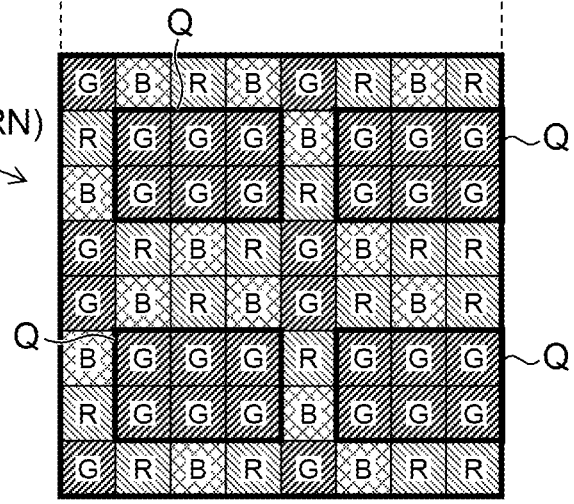

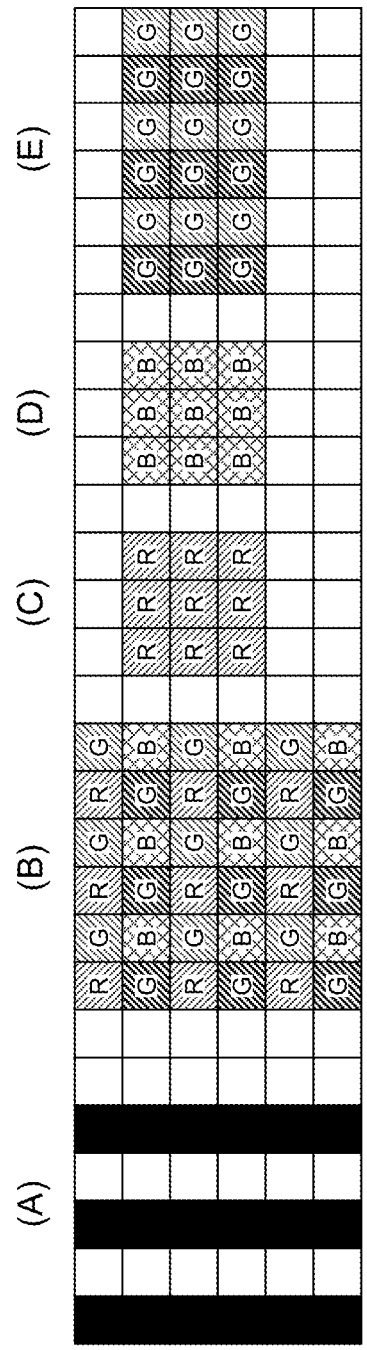

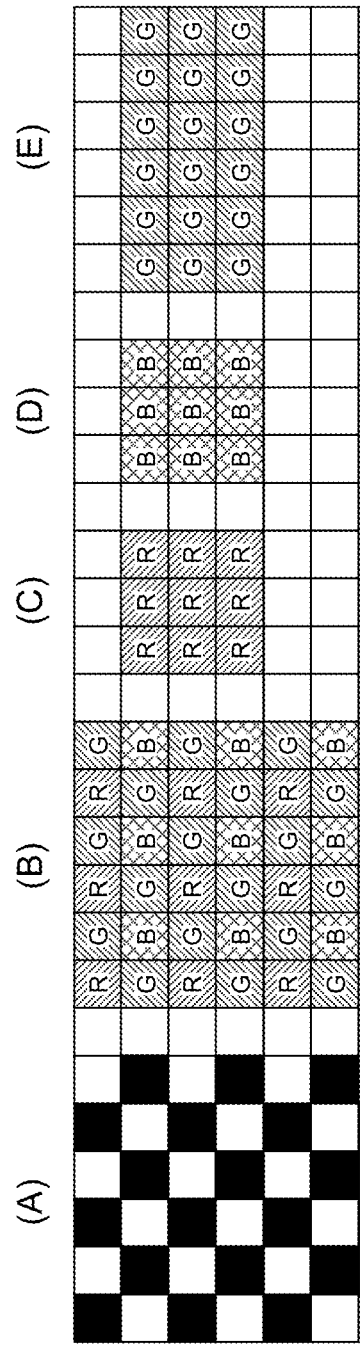

COLOR IMAGING ELEMENT AND IMAGING DEVICE

CROSS-REFERENCE TO RELATED APPLICATIONS

This application is a Continuation of PCT International Application No. PCT/JP2013/068230 filed on Jul. 3, 2013, which claims priority under 35 U.S.C. §119(a) to Japanese Patent Application No. 2012-152676 filed on Jul. 6, 2012. Each of the above application(s) is hereby expressly incorporated by reference, in its entirety, into the present application.

BACKGROUND OF THE INVENTION

1. Field of the Invention

The present invention relates to a color imaging element and an imaging device and, in particular, relates to a color imaging element capable of reducing occurrence of color moire and achieving high resolution, and an imaging device using such a color imaging element.

2. Description of the Related Art

In a single-plate color imaging element, a single color filter is provided on each pixel, and hence each pixel has color information about only a single color. For this reason, an output image of a single-plate color imaging element is a RAW image (mosaic image), and thus multichannel images are obtained by a process (demosaicing process) of interpolating a pixel of a missing color from surrounding pixels. What matters in this case is reproduction characteristics of a high frequency image signal. The color imaging element is likely to cause aliasing in a captured image in comparison with a monochrome imaging element, and thus it is important to achieve a high resolution by expanding a reproduction band while reducing occurrence of color moire (false color).

In a primary color Bayer array as a color array of color filters most widely used in the single-plate color imaging elements, green (G) pixels are placed in a checkered pattern, and red (R) and blue (B) pixels are disposed line-sequentially. Thus, there is a problem with reproduction precision when G signals generate high frequency signals in diagonal directions, and when R and B signals generate high frequency signals in horizontal and vertical directions.

Assume a case where a monochrome vertical stripe pattern (high frequency image) as indicated by the (A) portion in FIG. 14 is incident on a color imaging element including color filters in a Bayer array indicated by the (B) portion in FIG. 14. When this pattern is disposed in a Bayer color array and compared for each color, R forms a light and flat color image, B forms a dark and flat color image, and G forms a light and dark mosaic color image as indicated by the (C) to (E) portions in FIG. 14. There is no density difference (level difference) between RGB with respect to the original monochrome image, but the image is colored depending on a color array and an input frequency.

Similarly, assume a case where a diagonally monochrome high frequency image as indicated by the (A) portion in FIG. 15 is incident on an imaging element including color filters of a Bayer array indicated by the (B) portion in FIG. 15. When this pattern is disposed in a Bayer color array and compared for each color, R and B form light and flat color images, and G forms a dark and flat color image as indicated by the (C) to (E) portions in FIG. 15. Assuming that a value of black is 0 and a value of white is 255, the diagonally monochrome high frequency image turns green since only G is 255. Thus, the Bayer array cannot correctly reproduce a diagonal high frequency image.

Generally, in an imaging device using single-plate color imaging elements, optical low pass filters made of a birefringent material such as crystal are placed in front of the color imaging elements to optically reduce a high frequency wave, thereby avoiding this problem. This method can reduce coloring due to aliasing of a high frequency signal, but has a problem that the resolution lowers due to a negative effect of this method.

In order to solve such a problem, a color imaging element has been proposed, wherein a color filter array of the color imaging element is a three-color random array satisfying array limitation conditions in which arbitrary pixels of interest are adjacent to three colors including colors of the pixels of interest on any of four sides of the pixels of interest Japanese Patent Application Laid-Open No. 2000-308080).

In addition, an image sensor (color imaging element) with a color filter array has been proposed, wherein the image sensor includes a plurality of filters having different spectral sensitivities and in which first filters and second filters are alternately disposed in a first period in one of diagonal directions of a pixel grid of the image sensor, while the first filters and second filters are alternately disposed in a second period in the other one of the diagonal directions (Japanese Patent Application Laid-Open No. 2005-136766).

Further, a color array has been proposed, wherein the color array in a color solid state imaging element (color imaging element) of three primary colors of RGB equalizes appearance probabilities of each RGB by disposing sets of three pixels of horizontally-disposed R, G and B in a zig-zag pattern in the vertical direction, and allows arbitrary straight lines (horizontal, vertical and diagonal lines) on an imaging surface to pass through all colors (Japanese Patent Application Laid-Open No. 11-285012).

Furthermore, a color imaging element has been proposed, wherein R and B of the three primary colors of RGB are disposed every third pixel in the horizontal direction and in the vertical direction, and G is disposed between the R and B (Japanese Patent Application Laid-Open No. 8-23543).

SUMMARY OF THE INVENTION

The color imaging element described in Japanese Patent Application Laid-Open No. 2000-308080 needs to optimize each random pattern when demosaicing processing is performed in a subsequent stage since a color filter array is random, thus causing a problem of complicating the demosaicing processing. As used herein, the term "demosaicing processing" refers to a process of calculating (converting to a simultaneous type) all pieces of color information about RGB for each pixel from the RGB mosaic images due to the color filter array of the single-plate color imaging element. The term is also called "demosaicing process" or "synchronization processing" (which has the same meaning in the specification).

In addition, the color imaging element described in Japanese Patent Application Laid-Open No. 2005-136766 has a problem of poor pixel reproduction precision in a limited resolution region (particularly in the diagonal directions), because G pixels (brightness pixels) are placed in a checkered pattern.

The color imaging element described in Japanese Patent Application Laid-Open No. 11-285012 has a problem that high frequency reproducibility thereof is lower than that of the Bayer array because the ratios of the numbers of pixels of RGB are equal. Note that in case of the Bayer array, the ratio of the number of pixels of G, which contributes most to acquisition of a brightness signal, is twice as much as each of the numbers of pixels of R and B.

Meanwhile, the color imaging element described in Japanese Patent Application Laid-Open No. 8-23543 is not effective for a false color in a high frequency portion in a horizontal or vertical direction because the ratio of the number of pixels of G with respect to each of the numbers of pixels of R and B is six times higher than the ratio of the number of pixels of G in the Bayer array, and filter lines of only G pixels are located in the horizontal or vertical direction.

In view of the above circumstances, the present invention has been made, and an object of the present invention is to provide a color imaging element capable of reducing occurrence of false color and achieving high resolution and capable of simplifying the processing in a subsequent stage more than a conventional random array. In addition, another object of the present invention is to provide an imaging device using such a color imaging element.

A color imaging element for achieving the object of the present invention is a single-plate color imaging element including a plurality of pixels composed of photoelectric conversion elements disposed in a first direction and in a second direction perpendicular to the first direction, and color filters disposed on the plurality of pixels, wherein an array of the color filters includes a basic array pattern having the color filters arranged in an array pattern corresponding to M×N (M is 8 or more and N is 6 or more) pixels in the first direction and in the second direction, and the basic array pattern is repeatedly placed in the first direction and in the second direction; the basic array pattern includes a first filter corresponding to a first color having one or more colors and a second filter corresponding to a second color having two or more colors, in which a contribution ratio of the second color for acquiring a brightness signal is lower than the contribution ratio of the first color; the basic array pattern includes four or more rectangular patterns each corresponding to 3×2 pixels each composed of the first filter; the array of the color filters includes therein a grating filter line in the first direction and a grating filter line in the second direction, in which the first filter and the second filter are placed side by side surrounding the four directions of the rectangular pattern; in the array of the color filters, the first filter is disposed in each filter line in the first direction and in the second direction of the array of the color filters and in each filter line in a third direction and in a fourth direction inclined with respect to the first direction and the second direction; and in the basic array pattern, one or more of the second filters each corresponding to each color of the second colors are disposed in each filter line in the first direction and in the second direction.

In addition, a color imaging element for achieving the object of the present invention is a single-plate color imaging element including a plurality of pixels composed of photoelectric conversion elements disposed in a first direction and in a second direction perpendicular to the first direction, and color filters disposed on the plurality of pixels, wherein an array of the color filters includes a basic array pattern having the color filters arranged in an array pattern corresponding to M×N (M is 8 or more and N is 6 or more) pixels in the first direction and in the second direction, and the basic array pattern is repeatedly placed in the first direction and in the second direction; the basic array pattern includes a first filter corresponding to a first color having one or more colors, in which the peak transmittance of the first filter is in a range from 480 nm or more to 570 nm or less, and a second filter corresponding to a second color having two or more colors, in which the peak transmittance of the second filter is outside the range from 480 nm or more to 570 nm or less; the basic array pattern includes four or more rectangular patterns each corresponding to 3×2 pixels each composed of the first filter; the array of the color filters includes therein a grating filter line in the first direction and a grating filter line in the second direction, in which the first filter and the second filter are placed side by side surrounding the four directions of the rectangular pattern; in the array of the color filters, the first filter corresponding to any one color of the first colors is disposed in each filter line in the first direction and in the second direction of the array of the color filters and in each filter line in a third direction and in a fourth direction inclined with respect to the first direction and the second direction; and in the basic array pattern, one or more of the second filters each corresponding to each color of the second colors are disposed in each filter line in the first direction and in the second direction in the basic array pattern.

In addition, a color imaging element for achieving the object of the present invention is a single-plate color imaging element including a plurality of pixels composed of photoelectric conversion elements disposed in a first direction and in a second direction perpendicular to the first direction, and color filters disposed on the plurality of pixels, wherein an array of the color filters includes a basic array pattern having the color filters arranged in an array pattern corresponding to M×N (M is 8 or more and N is 6 or more) pixels in the first direction and in the second direction, and the basic array pattern is repeatedly placed in the first direction and in the second direction; the basic array pattern includes a first filter corresponding to a first color having one or more colors and a second filter corresponding to a second color having two or more colors, in which a transmittance of the second filter is lower than the transmittance of the first filter in a range of wavelength from 500 nm or more to 560 nm or less; the basic array pattern includes four or more rectangular patterns each corresponding to 3×2 pixels each composed of the first filter; the array of the color filters includes therein a grating filter line in the first direction and a grating filter line in the second direction, in which the first filter and the second filter are placed side by side surrounding the four directions of the rectangular pattern; in the array of the color filters, the first filter corresponding to any one color of the first colors is disposed in each filter line in the first direction and in the second direction of the array of the color filters and in each filter line in a third direction and in a fourth direction inclined with respect to the first direction and the second direction; and in the basic array pattern, one or more of the second filters each corresponding to each color of the second colors are disposed in each filter line in the first direction and in the second direction in the basic array pattern.

In addition, a color imaging element for achieving the object of the present invention is a single-plate color imaging element including a plurality of pixels composed of photoelectric conversion elements disposed in a first direction and in a second direction perpendicular to the first direction, and color filters disposed on the plurality of pixels, wherein an array of the color filters includes a basic array pattern having the color filters arranged in an array pattern corresponding to M×N (M is 8 or more and N is 6 or more) pixels in the first direction and in the second direction, and the basic array pattern is repeatedly placed in the first direction and in the second direction; the basic array pattern includes a first filter corresponding to a first color having two or more colors including a color contributing most to a brightness signal among three primary colors and a fourth color other than the three primary colors, and a second filter corresponding to a second color having two or more colors other than the first color; the basic array pattern includes four or more rectangular patterns each corresponding to 3×2 pixels each composed of the first filter; the array of the color filters includes therein a grating filter line in the first direction and a grating filter line in the second direction, in which the first filter and the second filter are placed side by side surrounding the four directions of the rectangular pattern; in the array of the color filters, the first filter is disposed in each filter line in the first direction and in the second direction of the array of the color filters and in each filter line in a third direction and in a fourth direction inclined with respect to the first direction and the second direction; and in the basic array pattern, one or more of the second filters each corresponding to each color of the second colors are disposed in each filter line in the first direction and in the second direction in the basic array pattern.

The present invention provides an array of the color filters in which one or more first filters are placed in a filter line in each direction from the first direction to the fourth direction, and thus can improve reproduction precision of demosaicing processing in a high frequency region.

In addition, the basic array pattern is repeatedly placed in the first direction and in the second direction, and thus the array of the color filters can be processed according to a repeating pattern when a process in a subsequent stage such as demosaicing processing is performed, thereby simplifying the process in a subsequent stage more than a conventional random array.

In addition, one or more of the second filters each corresponding to each color of the second colors are disposed in each filter line in the first direction and in the second direction in the basic array pattern. This configuration can reduce color moire (false color) which otherwise would occur by an input image having a high frequency component.

In addition, the basic array pattern includes therein the rectangular pattern corresponding to 3×2 pixels each composed of the first filter; and the grating filter line in the first direction and the grating filter line in the second direction, in which the first filter and the second filter corresponding to each color of the second colors are placed side by side surrounding the four directions of the rectangular pattern. Therefore, the regularity of the array patterns due to coupling between the rectangular patterns and the surrounding grating filter lines causes the abundance ratio of the number of pixels of the first color corresponding to the first filter to be greater than the abundance ratio of each of the numbers of pixels of each color of the second colors corresponding to the second filters, and at the same time can make it easy to evenly distribute the second filters over the entire color filter array, which can facilitate signal processing in a subsequent stage, and can improve the image reproduction precision and reliability.

It is preferable that in each grating filter line in the first direction and in the second direction, the first filter is disposed at a position on a diagonal line of the rectangular pattern. This configuration can efficiently dispose the first filter in the color filter array without increasing the size of the basic array pattern.

For example, the M×N of the basic array pattern is 8×6, the basic array pattern has four rectangular patterns, and each of the grating filter line in the first direction and the grating filter line in the second direction is 1 pixel wide. This configuration can minimize the size of the basic array pattern, and can achieve both improvement of image quality and simplification of signal processing.

It is preferable that in the basic array pattern, the grating filter line in the first direction and the grating filter line in the second direction have the same abundance ratio of filters of each color of the second colors.

It is preferable that at least one filter of each color of the second colors is disposed adjacent to each side of the four sides of the rectangular pattern.

It is preferable that in the color filter array, one or more second filters corresponding to each color of the second colors are placed in each filter line in the third direction and in the fourth direction.

It is preferable that the first color includes at least any of green and transparent.

It is preferable that the second color includes red and blue. The imaging device for achieving the object of the present invention includes an imaging optical system, a color imaging element forming a subject image through the imaging optical system, and an image data generation unit generating image data representing the formed subject image, wherein the color imaging element is a color imaging element according to any of the above aspects.

The color imaging element and the imaging device of the present invention can improve reproduction precision of demosaicing processing in a high frequency region and suppress aliasing. In addition, the color imaging element and the imaging device can achieve high resolution by reducing occurrence of color moire (false color). Further, the color imaging element and the imaging device can suppress complexity in a subsequent stage.

BRIEF DESCRIPTION OF THE DRAWINGS

FIG. 12 is a front view illustrating an example of a color filter array having a basic array pattern corresponding to 8×8 pixels.

FIG. 14 is a view used to explain a problem of the color imaging element having a color filter in the conventional Bayer array.

FIG. 15 is another view used to explain a problem of the color imaging element having a color filter in the conventional Bayer array.

DETAILED DESCRIPTION OF THE EMBODIMENTS

Entire Configuration of Digital Camera

Figure 1:
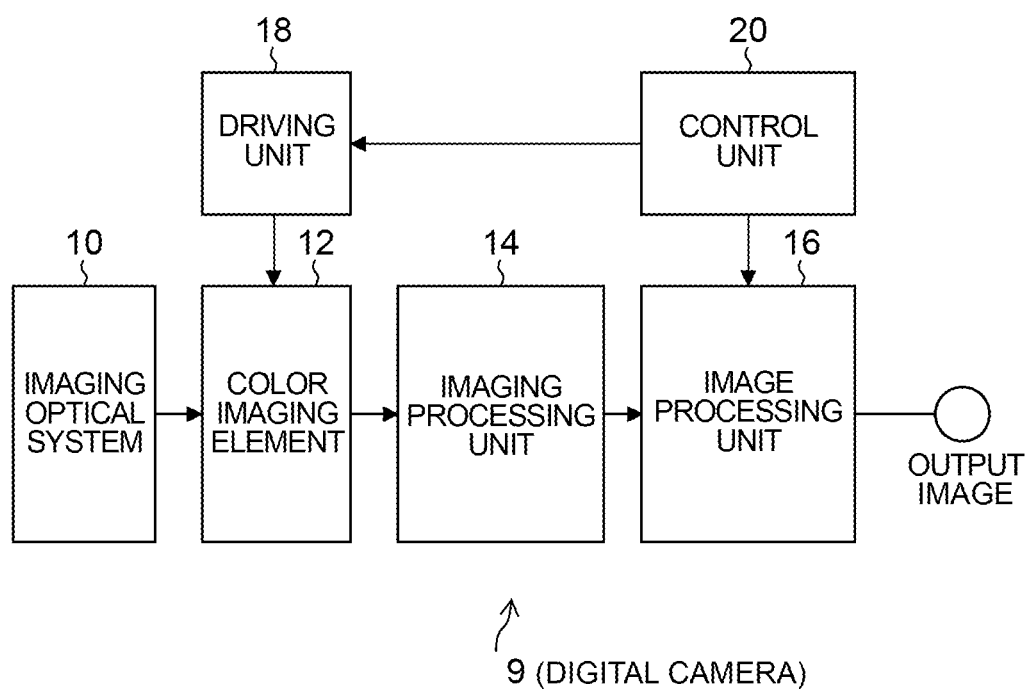
FIG. 1 is a block diagram illustrating an electrical configuration of a digital camera.

FIG. 1 is a block diagram illustrating a digital camera 9 (imaging device) having a color imaging element according to the present invention. The digital camera 9 is roughly divided into an imaging optical system 10, a color imaging element 12, an imaging processing unit 14, an image processing unit 16, a driving unit 18, a control unit 20, and the like.

The imaging optical system 10 forms a subject image on an imaging plane of the color imaging element 12. The color imaging element 12 is a so-called single-plate color imaging element including a plurality of pixels composed of photoelectric conversion elements arrayed (two-dimensionally arrayed) in a horizontal direction and a vertical direction in Figure on the imaging plane; and color filters provided above a light receiving plane of each pixel. As used herein, the terms "upper" and "above" refer to a direction from which subject light is incident on the imaging plane of the color imaging element 12.

The subject image formed on the color imaging element 12 is converted into a signal charge corresponding to the amount of incident light by the photoelectric conversion element of each pixel. Signal charges accumulated in each photoelectric conversion element are sequentially read from the color imaging element 12 as voltage signals (image signals) corresponding to the signal charges based on a driving pulse provided by the driving unit 18 in response to a command of the control unit 20. The image signals read from the color imaging element 12 are R, G, and B signals indicating red (R), green (G) and blue (B) mosaic images corresponding to the color filter array of the color imaging element 12. Note that the color imaging element 12 may be another type of imaging element such as a CCD (Charge Coupled Device) type imaging element and a CMOS (Complementary Metal Oxide Semiconductor) type imaging element.

The image signals read from the color imaging element 12 are inputted to the imaging processing unit 14 (image data generation unit). The imaging processing unit 14 includes a correlated double sampling circuit (CDS) for removing reset noise included in the image signals; an AGC circuit for amplifying an image signal and controlling the image signal at a certain level of magnitude; and an A/D converter. This imaging processing unit 14 performs correlated double sampling processing on the inputted image signal and amplifies the image signal, and then outputs RAW data obtained by converting the image signal into a digital image signal, to the image processing unit 16. Note that in a case where the color imaging element 12 is a MOS type imaging element, the A/D converter is usually housed in the imaging element, and thus the correlated double sampling processing may not be required.

The image processing unit 16 (image data generation unit) includes a white balance correction circuit; a gamma correction circuit; a demosaicing processing circuit (a processing circuit which calculates (converts to a simultaneous type) all pieces of color information of RGB for each pixel from RGB mosaic images related to the color filter array of the single-plate color imaging element 12); a brightness/color difference signal generation circuit; an outline correction circuit; a color correction circuit; and the like. In response to a command from the control unit 20, the image processing unit 16 performs a required signal processing on RAW data of the mosaic image inputted from the imaging processing unit 14 to generate RGB pixel signals having color information about all RGB for each pixel. Then, based on these signals, the image processing unit 16 generates image data (YUV data) composed of brightness data (Y data) and color difference data (Cr and Cb data).

Of the image data generated by the image processing unit 16, a still image is subjected to compression processing conforming to the JPEG standards, and a moving image is subjected to compression processing conforming to the MPEG2 standards by a compression/extension processing circuit. Then, the image data is recorded in an unillustrated recording medium (e.g., a memory card) and is outputted to be displayed on display means (not illustrated) such as a liquid crystal monitor. Note that in the present embodiment, the recording medium is not limited to the recording medium attachable to and detachable from the digital camera 9, but may be a built-in magneto-optical recording medium, and the display means is not limited to the means housed in the digital camera 9, but may be an external display connected to the digital camera 9.

[Color Imaging Element]

Figure 2:
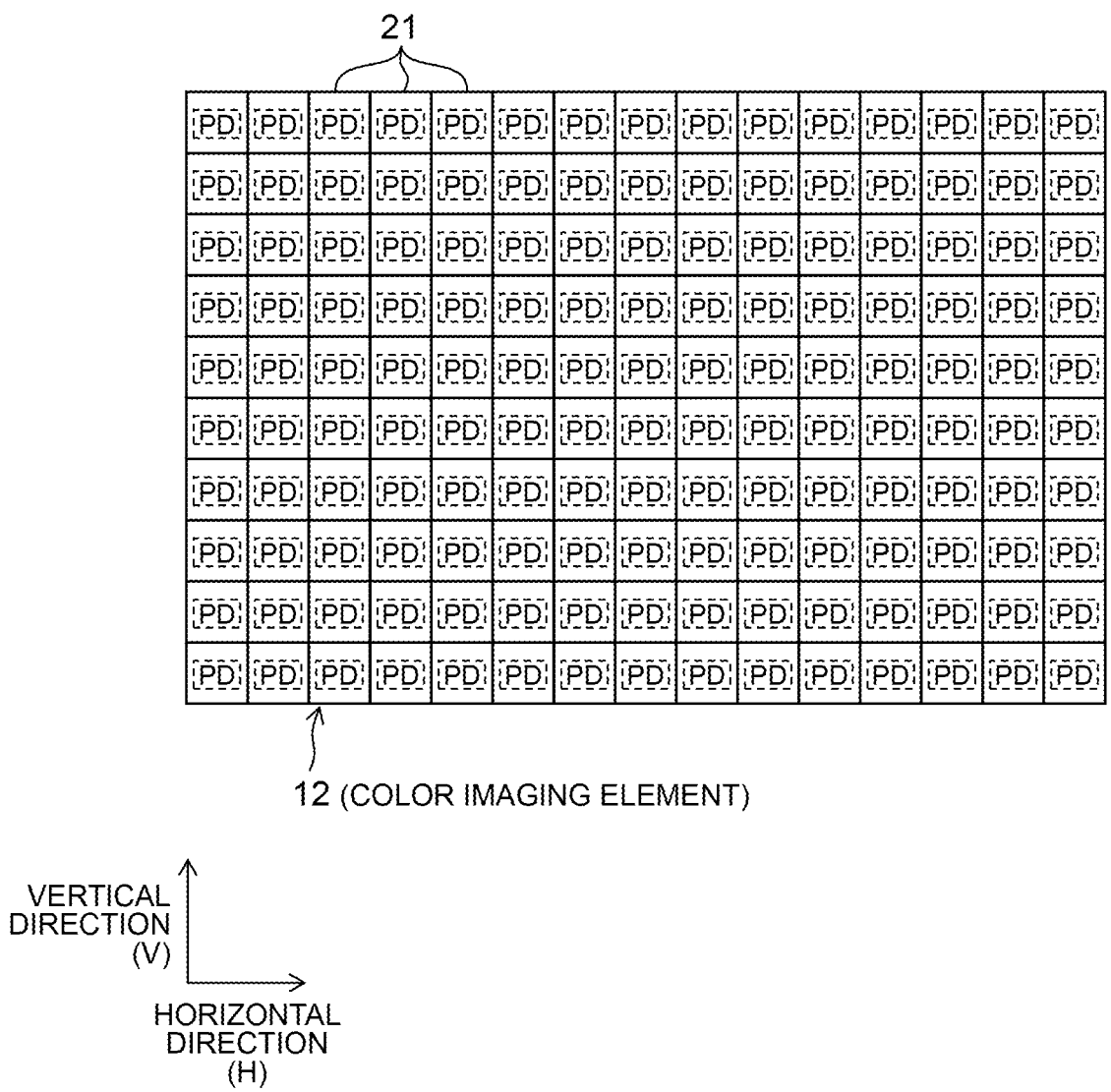
FIG. 2 is a front view of an imaging plane of a color imaging element.

As illustrated in FIG. 2, the imaging plane of the color imaging element 12 includes thereon a plurality of pixels 21 including photoelectric conversion elements PD two-dimensionally arrayed in a horizontal direction H and in a vertical direction V. As used herein, the horizontal direction H corresponds to one of the first direction and the second direction of the present invention, and the vertical direction V corresponds to the other of the first direction and the second direction of the present invention. In the following description, the horizontal direction H is referred to as the first direction, and the vertical direction V is referred to as the second direction.

Figure 3:
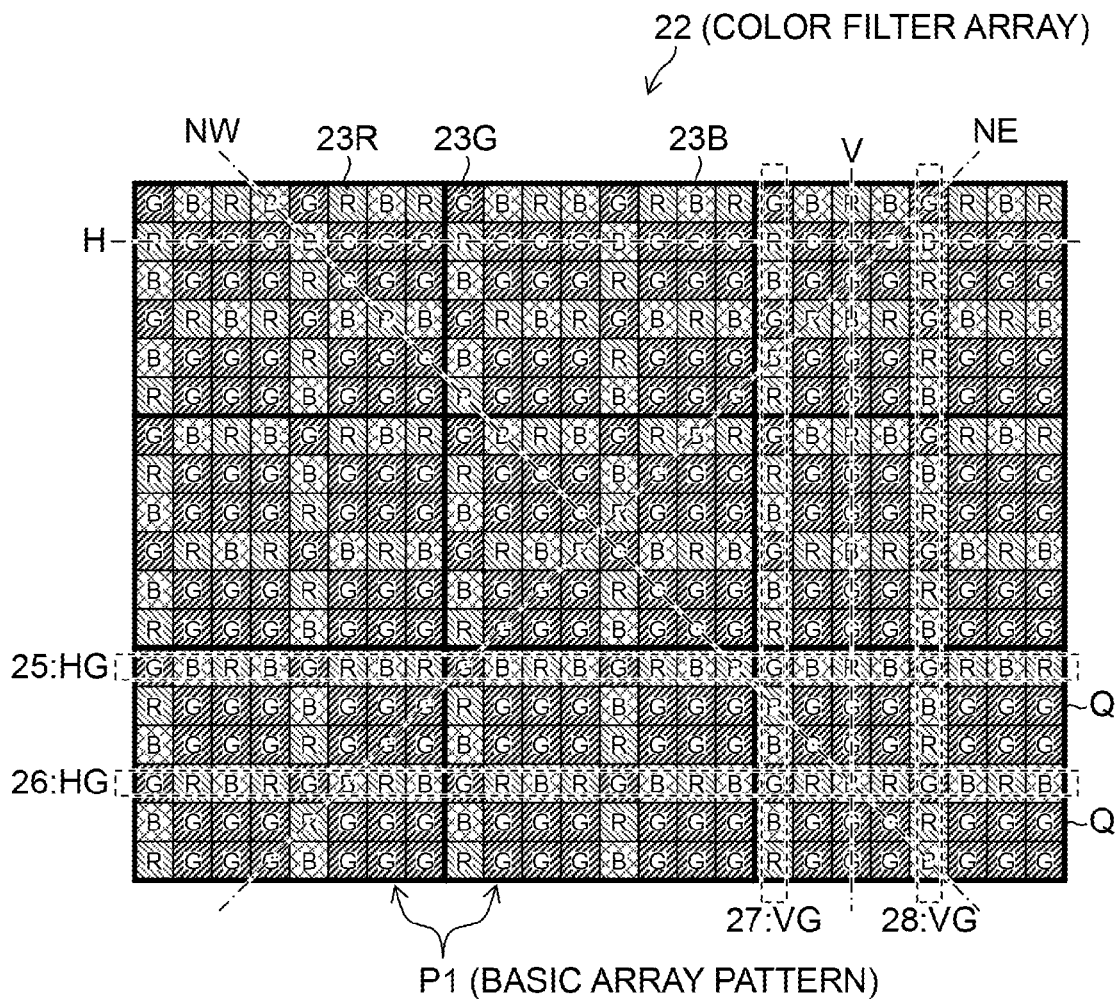
FIG. 3 is a front view of a color filter array according to a first embodiment.

As illustrated in FIG. 3, the imaging plane of the color imaging element 12 includes thereon a color filter array 22 including a color filter provided on each pixel 21. The color filter array 22 includes color filters 23R, 23G, and 23B (hereinafter referred to as an R filter, a G filter, and a B filter respectively) corresponding to three primary colors of red (R), green (G), and blue (B) respectively. Each pixel 21 includes thereon any of the R filter 23R, the G filter 23G, and the B filter 23B. Hereinafter, a pixel having the R filter 23R disposed thereon is referred to as an "R pixel", a pixel having the G filter 23G disposed thereon is referred to as a "G pixel", and a pixel having the B filter 23B disposed thereon is referred to as a "B pixel".

As used herein, the G color corresponds to the first color of the present invention, and the G filter 23G corresponds to the first filter of the present invention. In addition, the R color and the B color correspond to the second color of the present invention; and the R filter 23R and the B filter 23B correspond to the second filter of the present invention. Note that in the following description, any filter of the R filter 23R and the B filter 23B belonging to the second color filter are also referred to as an "RB filter".

[Color Filter Array According to First Embodiment]

The color filter array 22 has the following features (1), (2), (3), (4), (5), (6), (7) and (8).

[Feature (1)]

Figure 4:
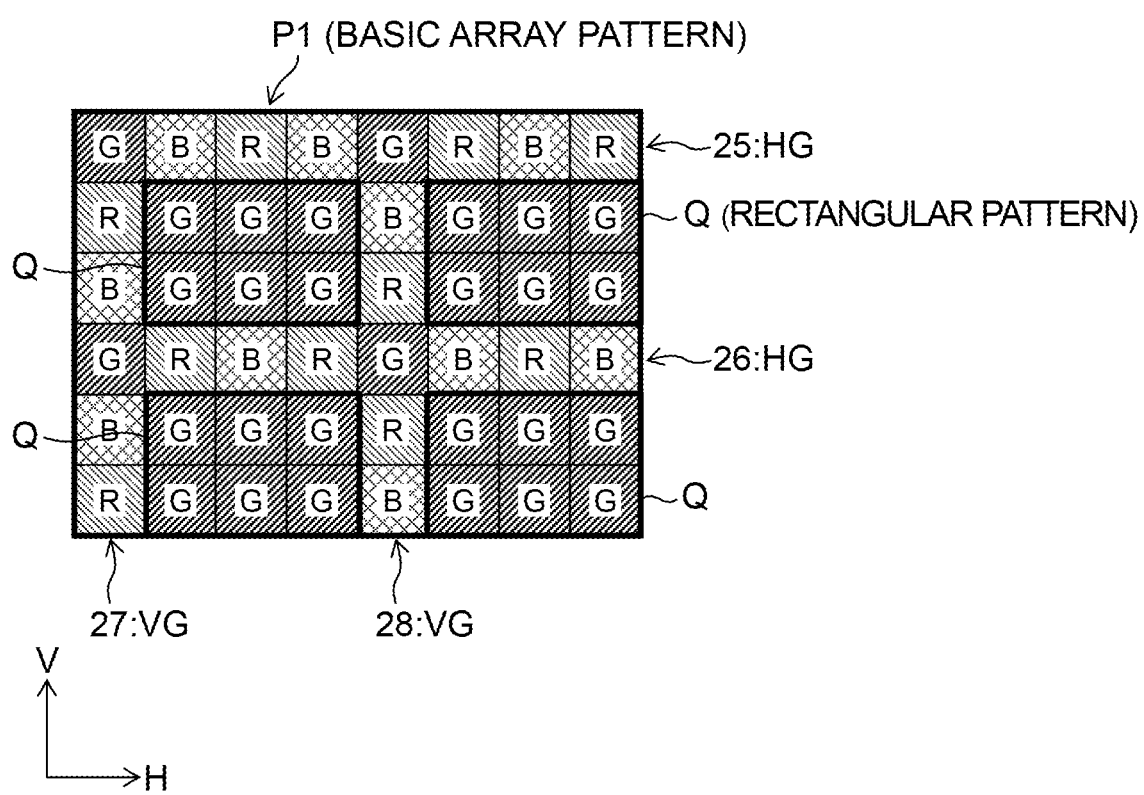
FIG. 4 is an enlarged view of a basic array pattern in FIG. 3.

As illustrated in FIGS. 3 and 4, the color filter array 22 includes the basic array pattern P1 arranged in an array pattern corresponding to 8×6 pixels, and the basic array pattern P1 is repeatedly placed in the first direction H and in the second direction V which are orthogonal to each other. Specifically, in the color filter array 22, the R filter 23R, the G filter 23G, and the B filter 23B of each color are periodically disposed. For this reason, the R, G, and B signals read from the color imaging element 12 can be subjected to demosaicing processing and other processing according to a repeating pattern. As a result, the color filter array 22 can simplify processing in a subsequent stage more than the conventional random array.

In addition, when thinning processing is performed in units of the basic array patterns P1 to reduce an image, the color filter array after the thinning processing is the same as the color filter array before the thinning processing, thus allowing a common processing circuit to be used.

The basic array pattern P1 includes color filters (the R filter 23R, the G filter 23G, and the B filter 23B) which are decisively disposed so as to satisfy the features (2) to (7).

[Feature (2)]

The color filter array 22 includes therein one or more G filters 23G (first filters) in each filter line of a first direction H, a second direction V, a third direction NE, and a fourth direction NW. In the present embodiment, the first direction H designates the horizontal direction, the second direction V designates the vertical direction, the third direction NE designates a lower-left-to-upper-right diagonal direction, and the fourth direction NW designates an upper-left-to-lower-right diagonal direction. The first direction H is orthogonal to the second direction V. The color filters (R filter 23R, G filter 23G, and B filter 23B) of the present embodiment are square, and thus the third direction NE and the fourth direction NW are inclined at 45° with respect to the first direction H and the second direction V respectively. Note that this angle may be increased or decreased according to the increase or decrease in the length of each side of the color filter in the first direction H and in the second direction V. For example, if the color filter is rectangle instead of square, the diagonal lines thereof correspond to the diagonal directions (the third direction NE and the fourth direction NW). Note that even if the color filter is rectangle instead of square, but if the color filters or pixels are placed in a square grid, the third direction NE and the fourth direction NW are inclined at 45° with respect to the first direction H and the second direction V respectively.

The contribution ratio of the G color for acquiring a brightness (Y) signal (above-described brightness data) is higher than the contribution ratio of the R color and the B color. In other words, the contribution ratio of the R color and the B color is lower than the contribution ratio of the G color. More specifically, the above-described image processing unit 16 generates an RGB pixel signal having color information about all RGB for each pixel. Then, based on the RGB pixel signal, the image processing unit 16 generates a Y signal according to the following expression (1). The following expression (1) is commonly used to generate the Y signal in the color imaging element 12. According to the expression (1), the contribution ratio of the G color is 60%. Consequently, the contribution ratio of the G color is higher than the contribution ratio of the R color (contribution ratio of 30%) and the B color (contribution ratio of 10%). Accordingly, the G color contributes most to the brightness signal among the three primary colors.

$$Y=0.3R+0.6G+0.1B \qquad \text{Expression (1)}$$

Such a G filter 23G is disposed in each filter line in the first direction H, in the second direction V, in the third direction NE, and in the fourth direction NW of the color filter array 22, which can improve reproduction precision of demosaicing processing in a high frequency region regardless of the direction of the high frequency in an input image.

[Feature (3)]

The number of pixels of the R pixel, the G pixel, and the B pixel corresponding to the RGB filters 23R, 23G, and 23B in the basic array pattern P1 is 10 pixels, 28 pixels, and 10 pixels respectively. In other words, the ratio of the number of each pixel of the RGB pixels is 5:14:5. Thus, the ratio of the number of pixels of the G pixel contributing most to obtainment of the brightness signal is greater than the ratio of the number of pixels of each of the R pixel and the B pixel.

As described above, the ratio of the number of G pixels is different from the ratio of the number of each of the R and B pixels and particularly the abundance ratio of the number of the G pixels contributing most to obtainment of the brightness signal is greater than the abundance ratio of the number of each of the R and B pixels, which can suppress aliasing at demosaicing processing and improve high frequency reproducibility.

[Feature (4)]

In the basic array pattern P1, one or more R filters 23R and B filters 23B are placed in each filter line in the first direction H and in the second direction V of the color filter array 22.

The R filters 23R and the B filters 23B are placed in each filter line in the first direction H and in the second direction V of the color filter array 22, which can reduce occurrence of color moire (false color). This can prevent an optical low pass filter for reducing occurrence of a false color from being disposed in an optical path from an incident plane of the imaging optical system 10 to the imaging plane of the color imaging element 12. In addition, when the optical low pass filter is applied, the optical low pass filter may be an optical low pass filter having a weak function to cut a high frequency component to prevent the occurrence of a false color. As a result, the resolution can be prevented from being lowered.

[Feature (5)]

The G filter 23G or the B filter 23B is placed adjacent to the R filter 23R satisfying the above feature (4) in each direction of the first direction H, and the second direction V. In addition, the G filter 23G or the R filter 23R is placed adjacent to the B filter 23B satisfying the above feature (4) in each direction of the first direction H and the second direction V. Accordingly, a different color filter is placed adjacent to the R filter 23R and the B filter 23B in the first direction H and the second direction V. In other words, the same R filters 23R or the same B filters 23B are not placed adjacent to each other in the first direction H and the second direction V.

Note that one or more R filters 23R and B filters 23B are placed on each filter line in the third direction NE and in the fourth direction NW of the color filter array 22. More specifically, the filter lines including the R filters 23R and the B filters 23B are periodically placed adjacent to each other in each diagonal direction (the third direction NE and the fourth direction NW). For this reason, the filter lines in the diagonal directions (NE and NW) including the R filters 23R and the B filters 23B as well as the G filters are placed adjacent to each other, which can effectively suppress color moire (false color) which otherwise would occur by an input image having a high frequency component. As used herein, the expression "the filter lines are adjacent in the diagonal directions" means that the distance between a filter line and a filter line is √2/2 pixel spacing, assuming that the length of one side of the square filter is 1.

As described above, when the RB filters 23R and 23B are disposed so as to satisfy the above features (4) and (5) in the color filter array 22, the RB filters 23R and 23B are evenly distributed in the color filter array 22, which can perform demosaicing processing on the R pixels and the B pixels with high precision.

As illustrated in FIGS. 3, and 4, the color filter array 22 of the present embodiment has the following feature (6).

[Feature (6)]

As illustrated in FIG. 4, the basic array pattern P1 includes four rectangular patterns Q each corresponding to 3×2 pixels. One rectangular pattern Q includes six G filters 23G.

At least 2×2 pixels of the G pixels are extracted from the 3×2 pixels each corresponding to such a rectangular pattern Q to calculate a difference absolute value of pixel values of a plurality of G pixels in the first direction H, a difference absolute value of pixel values of a plurality of G pixels in the second direction V, a difference absolute value of pixel values of a plurality of G pixels in the third direction NE, and a difference absolute value of pixel values of a plurality of G pixels in the fourth direction NW, which can determine that there is a correlation in the direction having the smallest difference absolute value among the first direction H, the second direction V, the third direction NE, and the fourth direction NW. Thus, the color filter array 22 can use information about the G pixel having a minimum pixel spacing in the rectangular pattern Q to determine a highly correlated direction among the first direction H, the second direction V, the third direction NE, and the fourth direction NW. The direction determination result can be used for a process (demosaicing processing) of interpolating from the surrounding pixels. Note that in this case, for example, a direction determination unit may be provided in the above-described image processing unit 16 (including the demosaicing processing circuit) to determine the direction.

In addition, as illustrated in FIGS. 3, and 4, the color filter array 22 of the present embodiment has the following feature (7).

[Feature (7)]

The color filter array 22 includes grating filter lines HG (25 and 26) in the first direction H, and grating filter lines VG (27 and 28) in the second direction V surrounding the four directions (upward direction, rightward direction, downward direction, and leftward direction in the Figure) of the rectangular patterns Q. The G filters (first filters corresponding to the first color) and the R filters and the B filters (second filters each corresponding to each color of the second colors) are placed side by side in the grating filter lines HG in the first direction H and in the grating filter lines VG in the second direction V.

In addition, as illustrated in FIGS. 3 and 4, the grating filter lines HG and VG of the present embodiment have the following additional feature (7-1), feature (7-2), and feature (7-3).

[Feature (7-1)]

In the basic array pattern P1, the ratio of the grating filter lines HG in the first direction H and the grating filter lines VG in the second direction V is equal to the ratio of each of the R filters 23R and the B filters 23B. In other words, according to the present embodiment, each basic array pattern P1 includes therein the same number of R filters 23R and B filters 23B placed in the grating filter lines HG in the first direction H and the same number of R filters 23R and B filters 23B placed in the grating filter line VG in the second direction V.

[Feature (7-2)]

At least one of the R filter 23R and the B filter 23B (a filter of each color of the second colors) is placed adjacent to each side of the four sides (upper side, right side, lower side, and left side in the Figure) of the rectangular pattern Q. In short, according to the present embodiment, one or two R filters 23R are placed adjacent to each side of the four sides of the rectangular pattern Q and one or two B filters 23B are placed adjacent to each side of the four sides of the rectangular pattern Q.

[Feature (7-3)]

As illustrated in FIG. 3, the grating filter line HG in the first direction H includes one 1-pixel wide filter lines 25 and 26, and the grating filter line VG in the second direction V includes one 1-pixel wide filter lines 27 and 28. In short, both the grating filter line HG and VG which are orthogonal to each other are 1 pixel wide.

[Feature (7-4)]

As illustrated in FIG. 3, the G filter 23G (first filter) is disposed at a position on a diagonal line of the rectangular pattern Q in the grating filter line HG in the first direction H and in the grating filter line VG in the second direction V. This configuration allows the G filters 23G to be evenly distributed in the color filter array 22 in the first direction H and in the second direction V without increasing the size of the basic array pattern P1.

According to the present embodiment, the G filter 23G is disposed only at a position on a diagonal line of the rectangular pattern Q in the grating filter lines HG and VG, which prevents the G filter 23G from continuing in the first direction H and in the second direction V between the rectangular patterns Q.

As illustrated in FIG. 3, the color filter array 22 of the present embodiment has the following feature (8).

[Feature (8)]

In the color filter array 22, one or more of the R filter 23R and the B filter 23B (second filters corresponding to each color of the second colors) are disposed in each filter line in the third direction NE and in the fourth direction NW.

When each filter in the central basic array pattern P among the nine basic array patterns P illustrated in FIG. 3 is viewed with a focus on the filters in the NE direction and the NW direction, it is understood that the R filters 23R and the B filters 23B is always present in each of the NE and NW directions.

Figure 5:
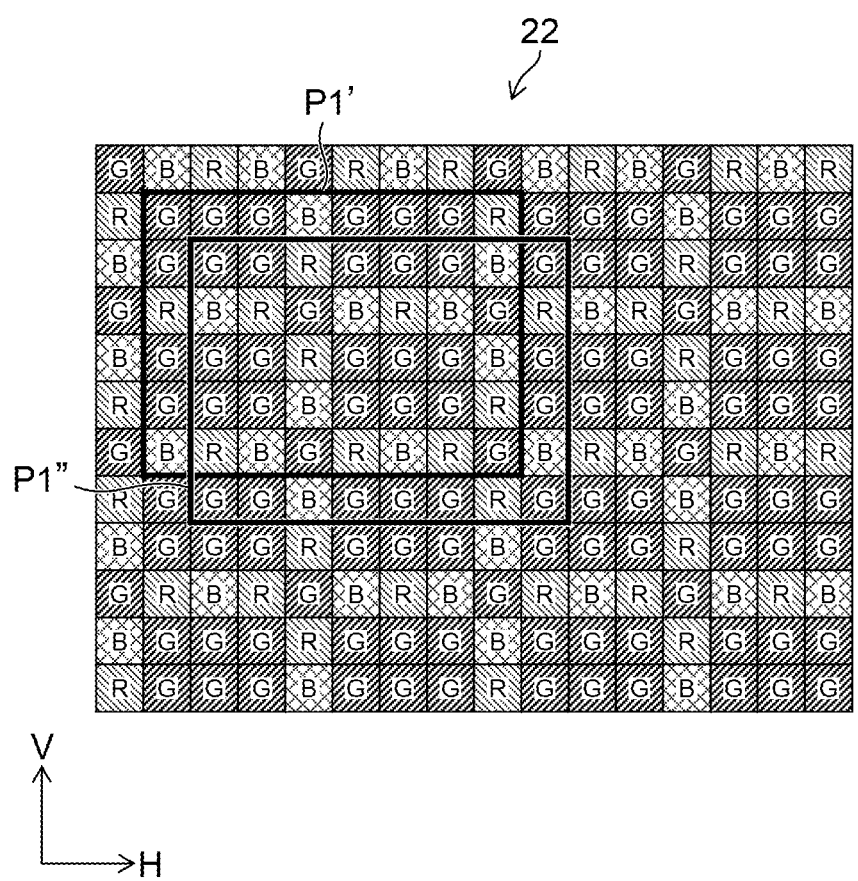
FIG. 5 is an explanatory drawing explaining a plurality of types of basic array patterns according to the first embodiment.

As illustrated in FIG. 5, assuming that a basic array pattern P1' is formed by shifting the basic array pattern P1 by one pixel in the horizontal direction and in the vertical direction and a basic array pattern P1" is formed by shifting the basic array pattern P1' by two pixels in the horizontal direction and in the vertical direction, the same color filter array 22 can be formed by repeatedly arranging the basic array patterns P1' and P1" in the horizontal direction and in the vertical direction. Thus, the color filter array 22 illustrated in FIG. 3 may include a plurality of basic array patterns. For the sake of convenience, the first embodiment uses the basic array pattern P1 illustrated in FIG. 4 as the basic array pattern.

As described above, the color filter array 22 of the present embodiment has the aforementioned features and thus can simplify demosaicing processing in a subsequent stage; can improve reproduction precision of the demosaicing processing in a high frequency region; can suppress aliasing and improve high frequency reproducibility at the demosaicing processing; can achieve high resolution; can improve the precision of the demosaicing processing of the R pixels; and can determine the highly correlated direction.

<Conditions of First Filter (First Color)>

The description of the above each embodiment has focused on the G filter 23G for the G color as an example of the first filter having the first color of the present invention, but instead of the G filters 23G or instead of some of the G filters 23G, a filter satisfying any of the following conditions (1) to (4) may be used.

[Condition (1)]

The condition (1) is that the contribution ratio for acquiring the brightness signal is 50% or higher. The contribution ratio of 50% is a value determined to distinguish between the first color (such as the G color) and the second color (such as the R color and the B color) of the present invention, and a value determined so that the "first color" includes a color whose contribution ratio for acquiring the brightness data is relatively higher than the contribution ratio of the R color, the B color, and the like. As shown in the above expression (1), the contribution ratio of the G color is 60%, which satisfies the condition (1). Note that the contribution ratio of a color other than the G color can also be acquired by experiments or simulations. Thus, a filter having a color, other than the G color, whose contribution ratio is 50% or higher can also be used as the first filter of the present invention. Note that a color whose contribution ratio is less than 50% serves as the second color (such as the R color and the B color) of the present invention and a filter having the color serves as the second filter of the present invention.

[Condition (2)]

The condition (2) is that the peak transmittance of the filter is in a range from a wavelength of 480 nm or more to 570 nm or less. For example, a value measured by a spectrophotometer is used for the transmittance of the filter. This wavelength range is also a range determined to distinguish between the first color (such as the G color) and the second color (such as the R color and the B color) of the present invention, and is a range determined not to include a peak of each of the R color and the B color each of whose contribution ratio described above is relatively low and to include a peak of the G color whose contribution ratio is relatively high. Thus, a filter whose peak transmittance is in a range from a wavelength of 480 nm or more to 570 nm or less can be used as the first filter. Note that a filter whose peak transmittance is outside a range from a wavelength of 480 nm or more to 570 nm or less serves as the second filter (the R filter 23R and the B filter 23B) of the present invention.

[Condition (3)]

The condition (3) is that the transmittance in a range from a wavelength of 500 nm or more to 560 nm or less is higher than the transmittance of the second filter (the R filter 23R and the B filter 23B). Also in the condition (3), for example, a value measured by a spectrophotometer is used for the transmittance of the filter. The wavelength range of the condition (3) is also a range determined to distinguish between the first color (such as the G color) and the second color (such as the R color and the B color) of the present invention, and is a range where the transmittance of a filter having a color whose contribution ratio described above is relatively higher than the contribution ratio of the R color and the B color is higher than the transmittance of each of the RB filters 23R and 23B. Thus, a filter whose transmittance is relatively high in a range from a wavelength of 500 nm or more to 560 nm or less can be used as the first filter, and a filter whose transmittance is relatively low can be used as the second filter.

[Condition (4)]

The condition (4) is that a filter having two or more colors including a color (such as the G color of the RGB) contributing most to the brightness signal among the three primary colors and a color different from the three primary colors is used as the first filter. In this case, a filter corresponding to a color other than each color of the first filter serves as the second filter.

[Color Imaging Element of Second Embodiment]

Next, with reference to FIG. 6, a color imaging element of the seventh embodiment of the present invention will be described. Note that the color imaging element of the second embodiment has basically the same configuration as the configuration of the color imaging element of the aforementioned first embodiment except for having a white pixel (also called a clear pixel) receiving white light (light in a visible light wavelength range) other than the RGB pixels. For this reason, the same reference numerals or characters are assigned to the same functions and configurations as the functions and the configurations of the above-described first embodiment, and description thereof is omitted.

[Color Filter Array of Second Embodiment]

The color imaging element of the second embodiment has a color filter array 32 different from the color filter array of the first embodiment. The color filter array 32 includes a basic array pattern P7 having the aforementioned RGB filters 23R, 23G, and 23B and transparent filter 23W (first filter) arranged in an array pattern corresponding to 8×6 pixels, and the basic array pattern P2 is repeatedly placed in the horizontal and vertical directions (H and V). For this reason, the color filter array 32 has the above-described feature (1).

The basic array pattern P2 has an array pattern formed by replacing some of the G filters 23G in the basic array pattern P1 with transparent filters 23W. For example, the G filter 23G adjacent to another G filter 23G in the horizontal and vertical directions (H and V) is replaced with a transparent filter 23W. Thus, according to the color imaging element of the second embodiment, some of the G pixels are replaced with white pixels. Consequently, even if pixel size is miniaturized, deterioration of color reproducibility can be suppressed.

The transparent filter 23W is a filter having a transparent color (first color). The transparent filter 23W can transmit light corresponding to a visible light wavelength range and, for example, serves as a filter where the transmittance of light of each color of the RGB is 50% or higher. The transmittance of the transparent filter 23W is higher than the transmittance of the G filter 23G, and thus the contribution ratio for acquiring the brightness signal is higher than the contribution ratio of the G color (60%), which satisfies the aforementioned condition (1).

Figure 7:
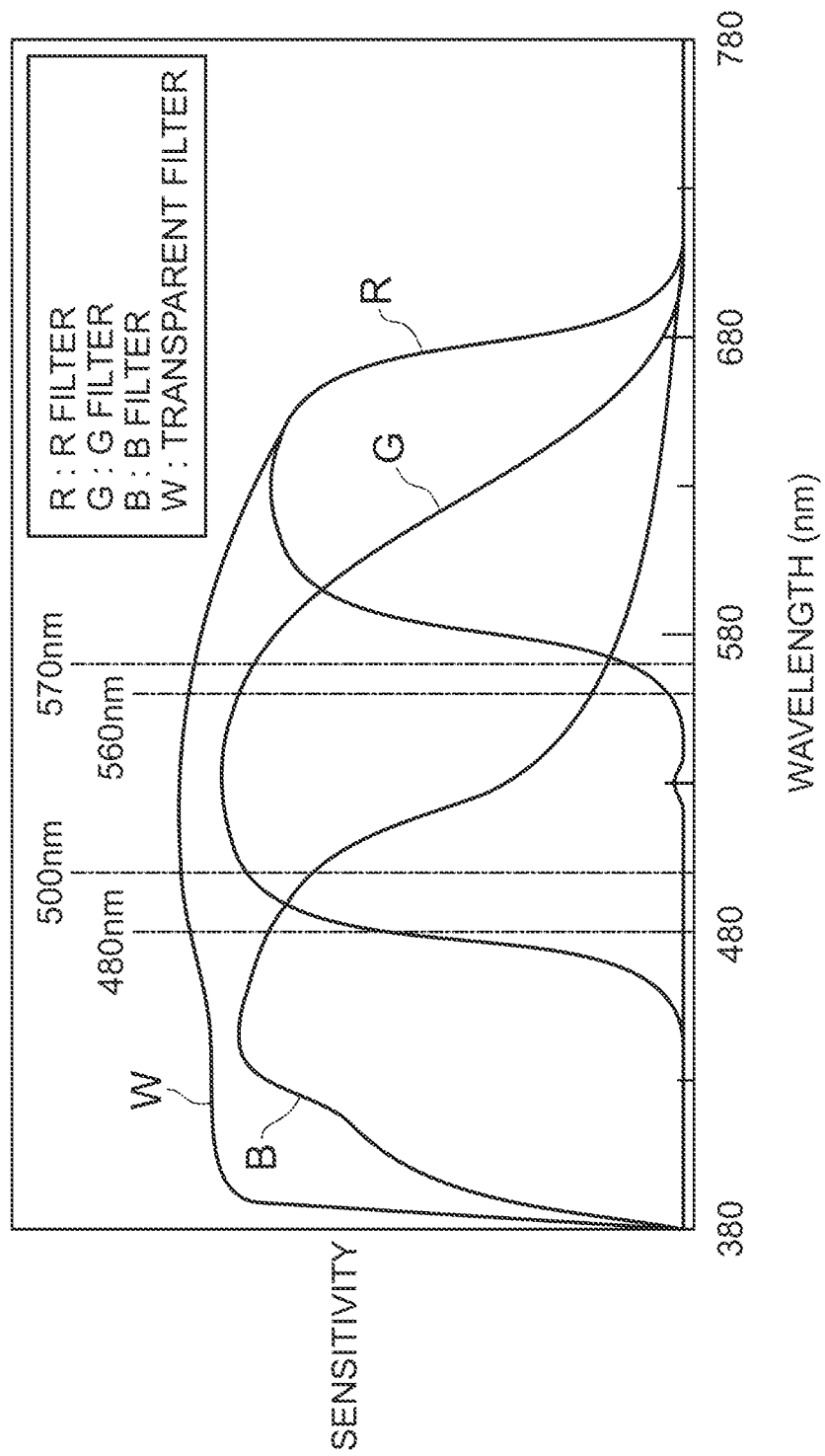
FIG. 7 is a graph illustrating spectral sensitivity characteristics of the color filter array according to the second embodiment.

In FIG. 7 illustrating spectral sensitivity characteristics of the color filter array 32, the peak transmittance of the transparent filter 23W (peak sensitivity of the white pixel) is in a range from a wavelength of 480 nm or more to 570 nm or less. In addition, the transmittance of the transparent filter 23W is in a range from a wavelength of 500 nm or more to 560 nm or less, which is higher than the transmittance of each of the RB filters 23R and 23B. Thus, the transparent filter 23W also satisfies the aforementioned conditions (2) and (3). Note that the G filter 23G also satisfies the aforementioned conditions (1) to (3) like the transparent filter 23W.

As described above, the transparent filter 23W satisfies the aforementioned conditions (1) to (3), and thus can be used as the first filter of the present invention. Note that the color filter array 32 replaces some of the G filters 23G corresponding to the G color contributing most to the brightness signal among the three primary colors of RGB with transparent filters 23W and thus also satisfies the aforementioned condition (4).

Figure 6:
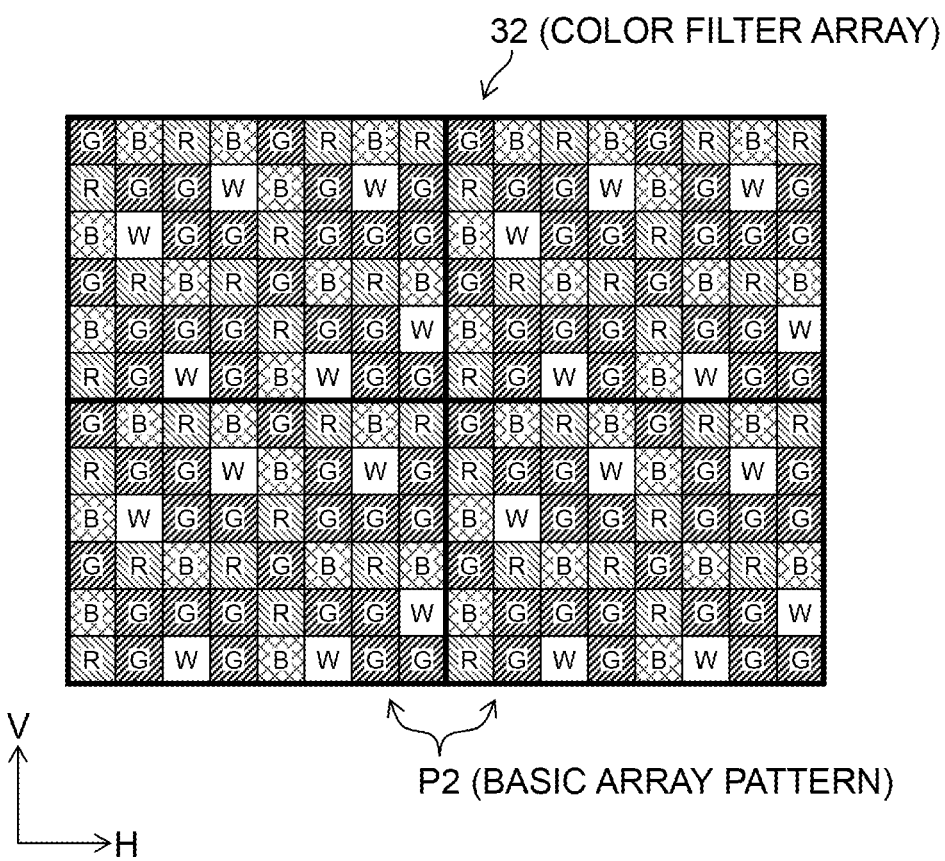
FIG. 6 is a front view of a color filter array according to a second embodiment.

Referring now back to FIG. 6, as described above, the color filter array 32 is basically the same as the color filter array 22 of the first embodiment except for replacing some of the G filters 23G with transparent filters 23W, and thus has the similar features (2) to (6) to the color filter array 22 of the first embodiment. Thus, the color filter array 63 can obtain the similar effects to the effects described in the first embodiment.

Note that the arrangement and the number of transparent filters 23W are not limited to those of the embodiment illustrated in FIG. 6, but may be appropriately changed. In this case, if one or more first filters including a G filter 23G and a transparent filter 23W are included in each filter line in each direction of the horizontal direction, the vertical direction, and the diagonal directions (NE and NW) of the color filter array 32, the first filters satisfy the aforementioned feature (2).

[Color Imaging Element of Third Embodiment]

Next, with reference to FIG. 8, a color imaging element of the eighth embodiment of the present invention will be described. Note that the color imaging element of the third embodiment has basically the same configuration as the configuration of the color imaging element of the aforementioned first embodiment except for having two types of G pixels. For this reason, the same reference numerals or characters are assigned to the same functions and configurations as the functions and the configurations of the above-described first embodiment, and description thereof is omitted.

[Color Filter Array of Third Embodiment]

The color imaging element of the third embodiment has a color filter array 42 different from the color filter array of the first embodiment. The color filter array 42 includes a basic array pattern P3 having R filters 23R, first G filters 23G1 and second G filters 23G2 (first filters), and B filters 23B arranged in an array pattern corresponding to 8×6 pixels, and the basic array pattern P3 is repeatedly placed in the horizontal and vertical directions (H and V). For this reason, the color filter array 42 has the above-described feature (1).

The basic array pattern P3 has an array pattern formed by replacing each G filter 23G in the basic array pattern P1 of the first embodiment with a first G filter 23G1 or a second G filter 23G2. For example, according to the present embodiment, the first G filters 23G1 and the second G filters 23G2 are disposed on the rectangular patterns Q of FIG. 4 in the same ratio, and on the grating filter line VG in the second direction V in the same ratio.

Figure 9:
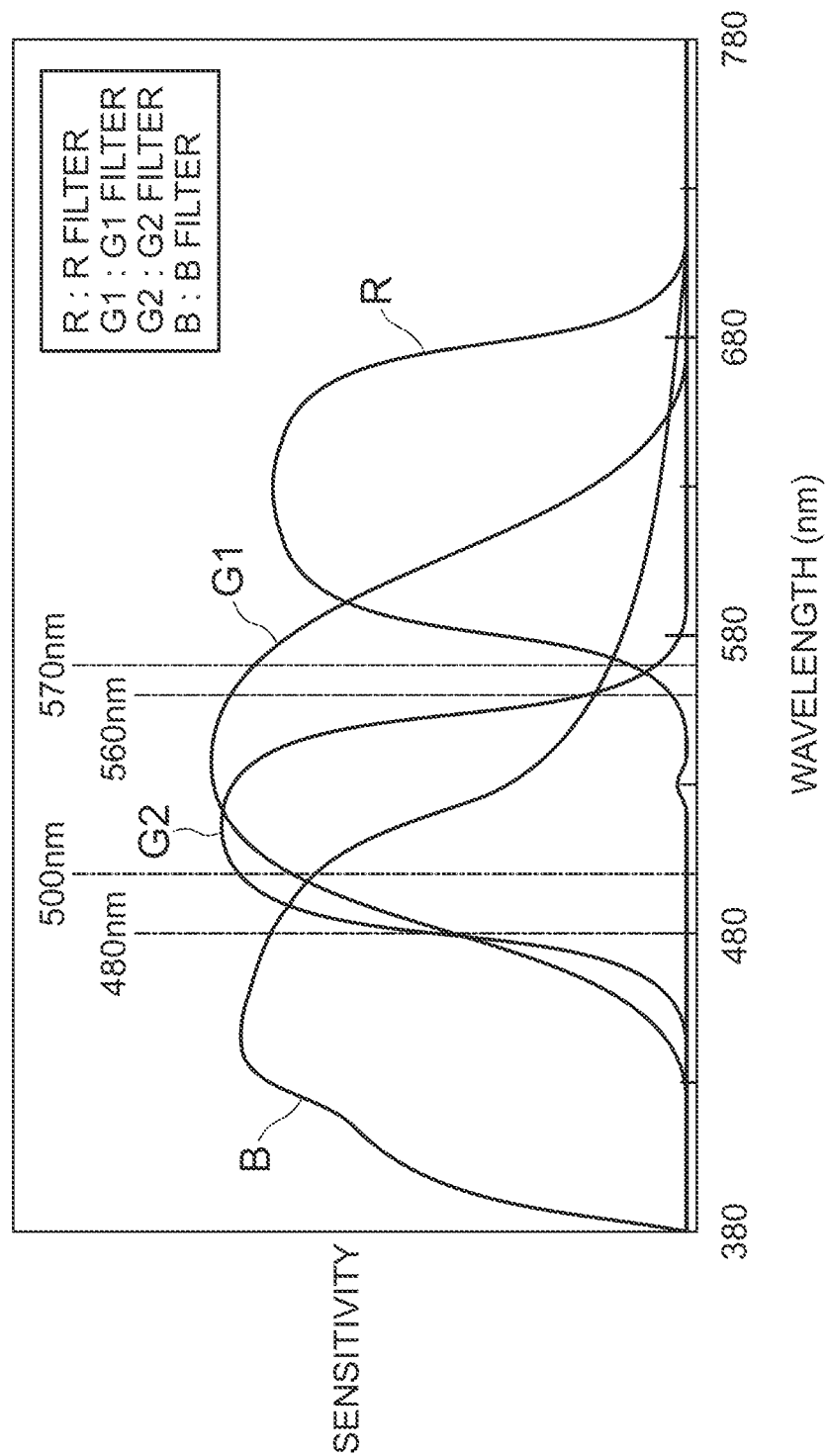
FIG. 9 is a graph illustrating spectral sensitivity characteristics of the color filter array according to the third embodiment.

The first G filter 23G1 transmits G light of a first wavelength band, and the second G filter 23G2 transmits G light of a second wavelength band having a high correlation with the first G filter 23G1 (see FIG. 9). An existing G filter (such as the G filter 23G of the first embodiment) can be used as the first G filter 23G1. In addition, a filter having a high correlation with the first G filter 23G1 can be used as the second G filter 23G2. In this case, it is preferable that the peak value of a spectral sensitivity curve of the second G filter 23G2 is in a range, for example, from a wavelength of 500 nm to 535 nm (near the peak value of a spectral sensitivity curve of the existing G filter). Note that for example, a method disclosed in Japanese Patent Application Laid-Open No. 2003-284084 is used as the method of determining the color filter having four colors.

As described above, the color imaging element of the third embodiment uses four types of colors of an image acquired thereby, which increases the amount of acquired color information. Thus, the present embodiment can more accurately reproduce colors than other embodiments acquiring only three types of colors (RGB). More specifically, colors seen different in the eyes can be reproduced as different colors, and colors seen identical in the eyes can be reproduced as identical colors, which can improve "color discrimination".

The transmittance of each of the first and second G filters 23G1 and 23G2 is basically the same as the transmittance of the G filter 23G of the first embodiment, and thus the contribution ratio for acquiring the brightness signal is higher than 50%. Accordingly, the first and second G filters 23G1 and 23G2 satisfy the aforementioned condition (1).

In addition, in FIG. 9 illustrating the spectral sensitivity characteristics of the color filter array 42, the peak transmittance of each of the G filters 23G1 and 23G2 (peak sensitivity of each G pixel) is in a range from a wavelength of 480 nm or more to 570 nm or less. The transmittance of each of the G filters 23G1 and 23G2 is in a range from a wavelength of 500 nm or more to 560 nm or less, which is higher than the transmittance of each of the RB filters 23R and 23B. For this reason, each of the G filters 23G1 and 23G2 also satisfies the aforementioned conditions (2) and (3).

Figure 8:
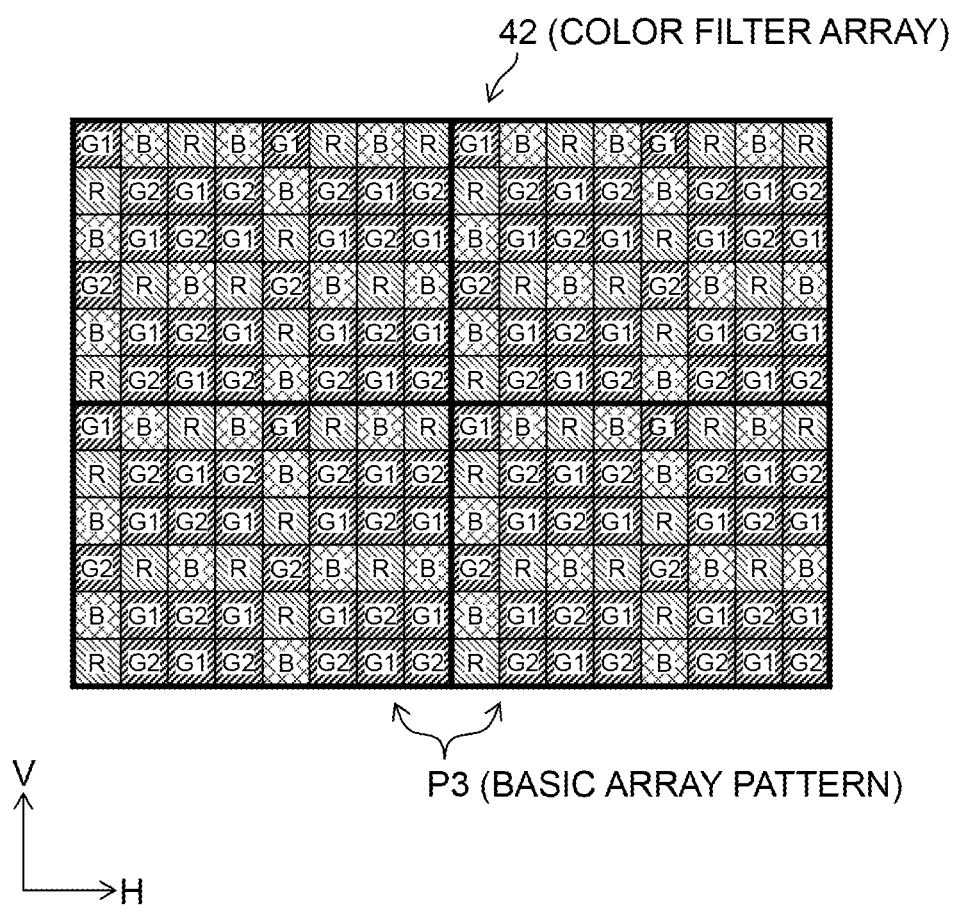
FIG. 8 is a front view of a color filter array according to a third embodiment.

Referring now back to FIG. 8, as described above, the color filter array 42 is basically the same as the color filter array 22 of the first embodiment except for having each of the G filters 23G1 and 23G2, and thus has the similar features (2) to (6) to the color filter array 22 of the first embodiment. Thus, the color filter array 64 can obtain the similar effects to the effects described in the first embodiment.

Note that the arrangement and the number of each of the G filters 23G1 and 23G2 are not limited to those of the embodiment illustrated in FIG. 8, but may be appropriately changed. In addition, the number of types of G filters may be increased to three or more.

[Color Imaging Element of Fourth Embodiment]

Next, with reference to FIG. 10, a color imaging element of the fifth embodiment of the present invention will be described. Note that the color imaging element of the fourth embodiment has basically the same configuration as the configuration of the color imaging element of the aforementioned first embodiment except for having an E pixel receiving light of an emerald (E) color corresponding to the fourth color of the present invention in addition to the RGB pixels. For this reason, the same reference numerals or characters are assigned to the same functions and configurations as the functions and the configurations of the above described first embodiment, and description thereof is omitted.

[Color Filter Array of Fourth Embodiment]

The color imaging element of the fourth embodiment has a color filter array 52 different from the color filter array of the first embodiment. The color filter array 52 includes a basic array pattern P4 having the RGB filters 23R, 23G, and 23B, and E filters 23E (first filters) arranged in an array pattern corresponding to 8×6 pixels, and the basic array pattern P4 is repeatedly placed in the horizontal and vertical directions (H and V). For this reason, the color filter array 52 has the above-described feature (1).

The basic array pattern P4 has an array pattern formed by replacing each transparent filter 23W in the basic array pattern P7 of the second embodiment illustrated in FIG. 6 with an E filter 23E. As described above, the color filter array 52 uses four types of colors obtained by replacing some of the G filters 23G with E filters 23E, which can improve the reproduction of high frequency components of brightness, reduce jagginess, and improve the perceived resolution.

Figure 11:
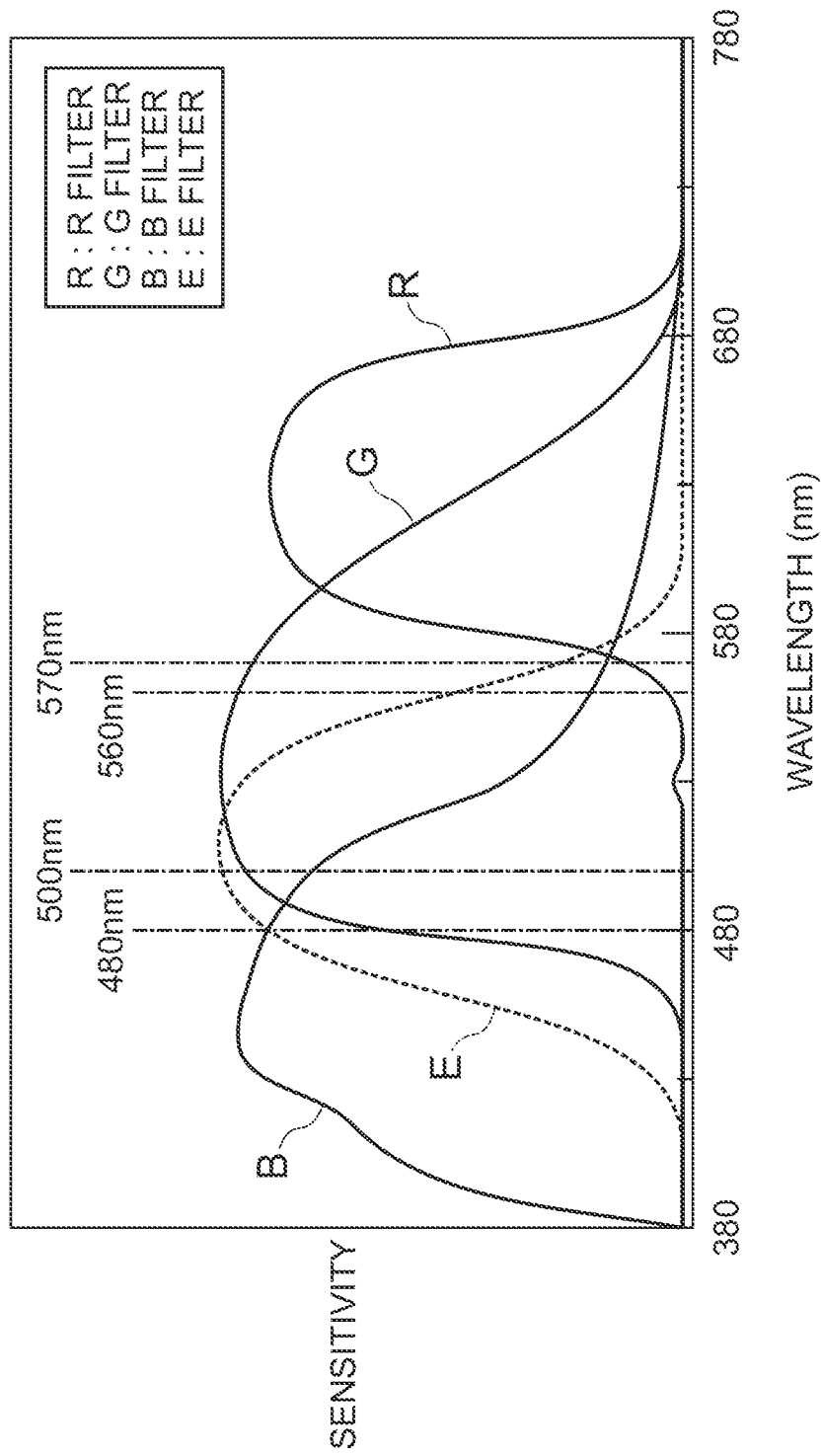
FIG. 11 is a graph illustrating spectral sensitivity characteristics of the color filter array according to the fourth embodiment.

In FIG. 11 illustrating the spectral sensitivity characteristics of the color filter array 52, the peak transmittance of the E filter 23E (peak sensitivity of the E pixel) is in a range from a wavelength of 480 nm or more to 570 nm or less. In addition, the transmittance of the E filter 23E is in a range from a wavelength of 500 nm or more to 560 nm or less, which is higher than the transmittance of each of the RB filters 23R and 23B. For this reason, the E filter 23E satisfies the aforementioned conditions (2) and (3). Note that the color filter array 52 replaces some of the G filters 23G corresponding to the G color contributing most to the brightness signal among the three primary colors of RGB with E filters 23E and thus also satisfies the aforementioned condition (4).

Note that in the spectral characteristics illustrated in FIG. 11, the E filter 23E has a peak closer to a short wavelength side than a peak of the G filter 23G, but may have a peak closer to a long wavelength side than the peak of the G filter 23G (the color appears to be a little closer to yellow) in some cases. As described above, a filter satisfying each condition of the present invention can be selected as the E filter 23E. For example, an E filter 23E satisfying the condition (1) can be selected.

Figure 10:
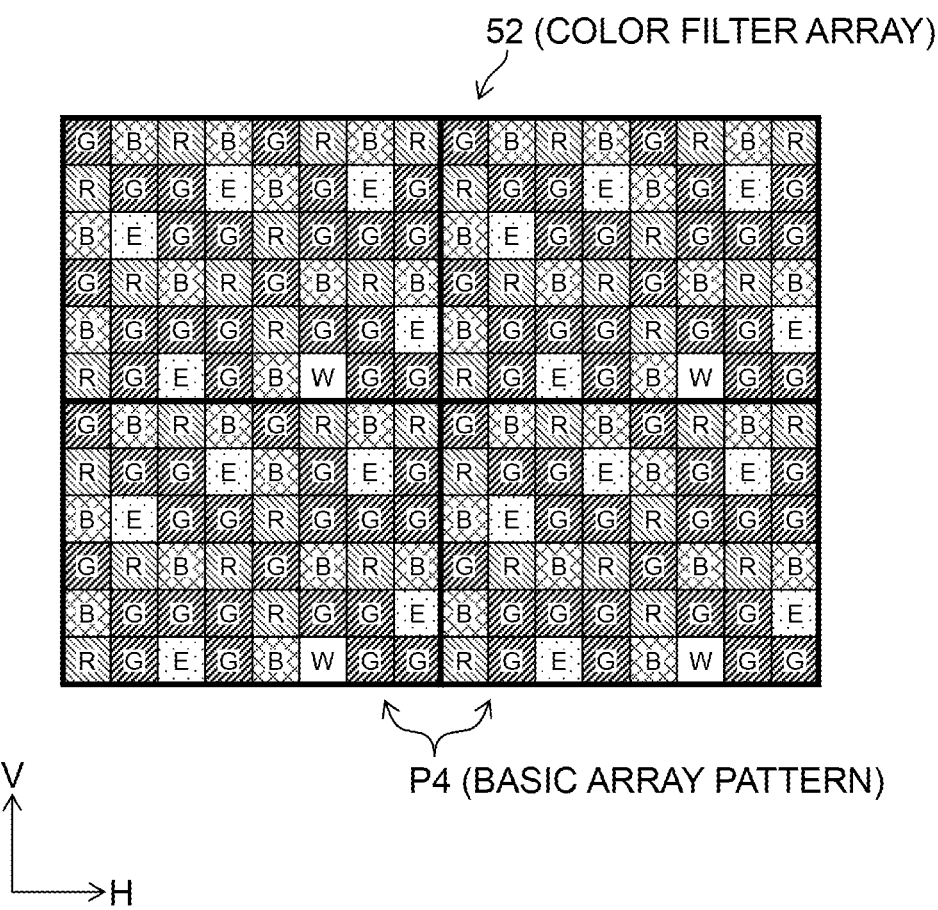
FIG. 10 is a front view of a color filter array according to a fourth embodiment.

Referring now back to FIG. 10, as described above, the color filter array 52 is basically the same as the color filter array 22 of the first embodiment except for replacing some of the G filters 23G with E filters 23E, and thus has the similar features (2) to (6) to the color filter array 22 of the first embodiment. Thus, the color filter array 52 can obtain the similar effects to the effects described in the first embodiment.

Note that the arrangement and the number of E filters 23E may be different from the arrangement and the number of the embodiment illustrated in FIG. 10. In this case, if one or more first filters including a G filter 23G and an E filter 23E are included in the filter line in each direction of the horizontal direction, the vertical direction, and the diagonal directions (NE and NW) of the color filter array 52, the first filters satisfy the aforementioned feature (2).

Note that the aforementioned fourth embodiment uses the E filter 23E as the first filter of the present invention, but for example, some of the E filters 23E do not satisfy the aforementioned conditions (1) to (4). Thus, such E filters 23E may be used as the second filter of the present invention.

[Others]

The basic array pattern in each color filter array of the above each embodiment includes an array pattern corresponding to the 8×6 pixels, but may be a basic array pattern having an array pattern corresponding to the 8 or more pixels in the first direction H and the 6 or more pixels in the second direction V. For example, the color filter array may include a basic array pattern corresponding to the 8×8 pixels.

The basic array pattern P5 in the color filter array 62 illustrated in FIG. 12 is an 8×8 pixel array pattern.

The basic array pattern P5 is basically the same as the basic array pattern P1 of the first embodiment except for replacing the basic array pattern P1 of the first embodiment with an 8×8 pixel array pattern. Thus, the color filter array 62 has features similar to the features (1) to (8) of the color filter array 22 of the first embodiment.

Note that although not illustrated, the basic array pattern of each embodiment may be changed to another array pattern corresponding to M pixels×N pixels (the value of M is 8 or more and the value of N is 6 or more). Note that an increase in the number of pixels of the basic array pattern complicates signal processing such as synchronization processing, but an increase in the size of the basic array pattern does not provide an exceptional effect. Thus, from the viewpoint of preventing the complication of the signal processing, it is preferable that the size of the basic array pattern is not too large such as 8 pixels or less×8 pixels or less, and from the viewpoint of simplifying the signal processing, the basic array pattern corresponding to the 8×6 pixels is more preferable.

In each color filter array of the aforementioned each embodiment, the color filter of each color includes a basic array pattern two-dimensionally arrayed in the horizontal direction (H) and in the vertical direction (V), and the basic array pattern is repeatedly placed in the horizontal direction (H) and in the vertical direction (V), but the present invention is not limited to this.

Figure 13:
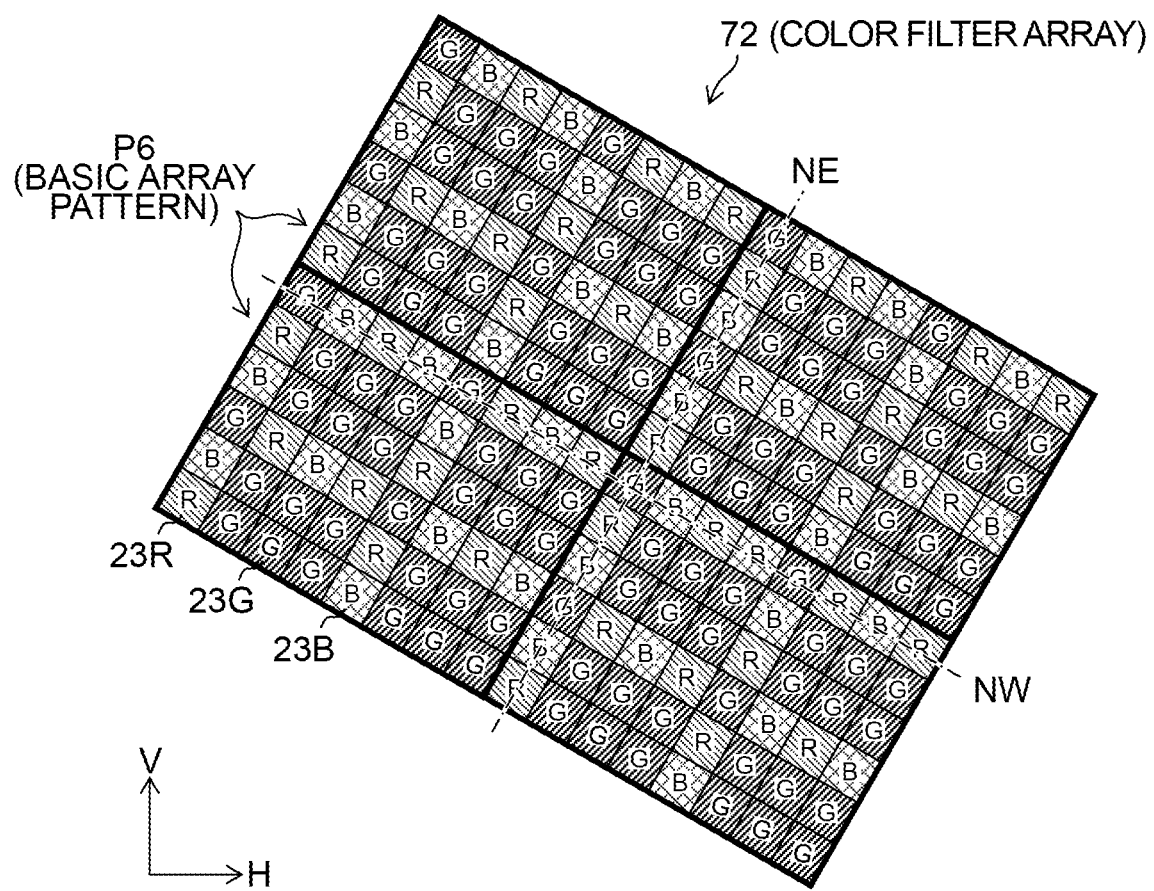
FIG. 13 is a front view illustrating an example of a color filter array configured as a honeycomb arrangement according to other embodiment.

For example, like a color filter array 72 illustrated in FIG. 13, the array pattern may be such that the array pattern includes a basic array pattern P9 in a so-called honeycomb array (honeycomb arrangement) formed by two-dimensionally placing the RGB filters 23R, 23G and 23B in the diagonal directions (NE and NW), and the basic array pattern P6 is repeatedly placed in the diagonal directions (NE and NW). In this case, the diagonal directions (NE and NW) correspond to the first direction and the second direction of the present invention respectively; and the horizontal direction and the vertical direction correspond to the third direction and the fourth direction of the present invention respectively.

The color filter array 52 has an array pattern obtained by rotating the color filter array 22 of the first embodiment by 45° around the optical axis of the imaging optical system 10, and thus has the similar features (1) to (8) to the color filter array 22 of the first embodiment. Although not illustrated, the basic array patterns P2 to P5 may also be a honeycomb array as described above.

The first embodiment has described as the color filter array including an RGB primary color filter, but for example, the present invention can be applied to a four-color complementary-type color filter array using color filters of complementary colors cyan (C), magenta (M), and yellow (Y) (respectively corresponding to primary colors R, G, and B) and further using a color filter of green (G). Also in this case, a color filter satisfying any of the aforementioned conditions (1) to (4) corresponds to the first filter of the present invention and the other color filters correspond to the second filter of the present invention.

As described above, the color filter array 22 of the present embodiment (A) can simplify demosaicing processing in a subsequent stage; (B) can improve reproduction precision of the demosaicing processing in a high frequency region; (C) can suppress aliasing and improve high frequency reproducibility at the demosaicing processing; (D) can improve precision of the demosaicing processing of the R pixels and the B pixels; and can achieve high resolution.

Note that the color filter array of the color imaging element of the present invention is not limited to the above-described embodiments, but it will be apparent that various modifications can be made to the present invention without departing from the spirit and scope of the present invention. For example, the color filter array of the aforementioned each embodiment may be appropriately combined. In addition, a filter combining at least any two types of filters selected from among the G filters 23G, the transparent filters 23W, the first and second G filters 23G1 and the 23G2, E filters 23E may be used as the first filters of the present invention, or a filter of the other color satisfying any of the aforementioned conditions (1) to (4) may be used. Further, a color filter other than the RB filters 23R and 23B may be used as the second filter of the present invention.

The above each embodiment has described the color imaging element to be mounted on a digital camera, but for example, the present invention can be applied to a color imaging element to be mounted on various electronic devices (imaging devices) having an imaging function such as smartphones, mobile phones, and PDAs.

What is claimed is:

1. A color imaging element as a single-plate color imaging element comprising:
   a plurality of pixels composed of photoelectric conversion elements disposed in a first direction and in a second direction perpendicular to the first direction; and
   color filters disposed on the plurality of pixels, wherein
   an array of the color filters includes a basic array pattern having the color filters arranged in an array pattern corresponding to M×N pixels in the first direction and in the second direction, where M is 8 or more and N is 6 or more, and the basic array pattern is repeatedly placed in the first direction and in the second direction,
   the basic array pattern includes a first filter corresponding to a first color having one or more colors and a second filter corresponding to a second color having two or more colors, in which a contribution ratio of the second color for acquiring a brightness signal is lower than the contribution ratio of the first color, the basic array pattern includes four or more rectangular patterns each corresponding to 3×2 pixels each composed of the first filter, the array of the color filters includes therein a grating filter line in the first direction and a grating filter line in the second direction, in which the first filter and the second filter corresponding to each color of the second colors are placed side by side surrounding the four directions of the rectangular pattern, in the array of the color filters, the first filter is disposed in each filter line in the first direction and in the second direction of the array of the color filters and in each filter line in a third direction and in a fourth direction inclined with respect to the first direction and the second direction, and in the basic array pattern, one or more of the second filters each corresponding to each color of the second colors are disposed in each filter line in the first direction and in the second direction.

2. A color imaging element as a single-plate color imaging element comprising:

a plurality of pixels composed of photoelectric conversion elements disposed in a first direction and in a second direction perpendicular to the first direction; and color filters disposed on the plurality of pixels, wherein an array of the color filters includes a basic array pattern having the color filters arranged in an array pattern corresponding to M×N pixels in the first direction and in the second direction, where M is 8 or more and N is 6 or more, and the basic array pattern is repeatedly placed in the first direction and in the second direction, the basic array pattern includes a first filter corresponding to a first color having one or more colors, in which a peak transmittance of the first filter is in a range from 480 nm or more to 570 nm or less, and a second filter corresponding to a second color having two or more colors, in which the peak transmittance of the second filter is outside the range, the basic array pattern includes four or more rectangular patterns each corresponding to 3×2 pixels each composed of the first filter, the array of the color filters includes therein a grating filter line in the first direction and a grating filter line in the second direction, in which the first filter and the second filter corresponding to each color of the second colors are placed side by side surrounding the four directions of the rectangular pattern, in the array of the color filters, the first filter corresponding to any one color of the first colors is disposed in each filter line in the first direction and in the second direction of the array of the color filters and in each filter line in a third direction and in a fourth direction inclined with respect to the first direction and the second direction, and in the basic array pattern, one or more of the second filters each corresponding to each color of the second colors are disposed in each filter line in the first direction and in the second direction in the basic array pattern.

3. A color imaging element as a single-plate color imaging element comprising:

a plurality of pixels composed of photoelectric conversion elements disposed in a first direction and in a second direction perpendicular to the first direction; and color filters disposed on the plurality of pixels, wherein an array of the color filters includes a basic array pattern having the color filters arranged in an array pattern corresponding to M×N pixels in the first direction and in the second direction, where M is 8 or more and N is 6 or more, and the basic array pattern is repeatedly placed in the first direction and in the second direction, the basic array pattern includes a first filter corresponding to a first color having one or more colors and a second filter corresponding to a second color having two or more colors, in which a transmittance of the second filter is lower than the transmittance of the first filter in a range of wavelength from 500 nm or more to 560 nm or less, the basic array pattern includes four or more rectangular patterns each corresponding to 3×2 pixels each composed of the first filter, the array of the color filters includes therein a grating filter line in the first direction and a grating filter line in the second direction, in which the first filter and the second filter corresponding to each color of the second colors are placed side by side surrounding the four directions of the rectangular pattern, in the array of the color filters, the first filter corresponding to any one color of the first colors is disposed in each filter line in the first direction and in the second direction of the array of the color filters and in each filter line in a third direction and in a fourth direction inclined with respect to the first direction and the second direction, and in the basic array pattern, one or more of the second filters each corresponding to each color of the second colors are disposed in each filter line in the first direction and in the second direction in the basic array pattern.

4. A color imaging element as a single-plate color imaging element comprising:

a plurality of pixels composed of photoelectric conversion elements disposed in a first direction and in a second direction perpendicular to the first direction; and color filters disposed on the plurality of pixels, wherein an array of the color filters includes a basic array pattern having the color filters arranged in an array pattern corresponding to M×N pixels in the first direction and in the second direction, where M is 8 or more and N is 6 or more, and the basic array pattern is repeatedly placed in the first direction and in the second direction, the basic array pattern includes a first filter corresponding to a first color having two or more colors including a color contributing most to a brightness signal among three primary colors and a fourth color other than the three primary colors, and a second filter corresponding to a second color having two or more colors other than the first color, the basic array pattern includes four or more rectangular patterns each corresponding to 3×2 pixels each composed of the first filter, the array of the color filters includes therein a grating filter line in the first direction and a grating filter line in the second direction, in which the first filter and the second filter corresponding to each color of the second colors are placed side by side surrounding the four directions of the rectangular pattern, in the array of the color filters, the first filter is disposed in each filter line in the first direction and in the second direction of the array of the color filters and in each filter line in a third direction and in a fourth direction inclined with respect to the first direction and the second direction, and in the basic array pattern, one or more of the second filters each corresponding to each color of the second colors are disposed in each filter line in the first direction and in the second direction in the basic array pattern.

5. The color imaging element according to claim 1, wherein in each grating filter line in the first direction and in the second direction, the first filter is disposed at a position on a diagonal line of the rectangular pattern.

6. The color imaging element according to claim 2, wherein in each grating filter line in the first direction and in the second direction, the first filter is disposed at a position on a diagonal line of the rectangular pattern.

7. The color imaging element according to claim 3, wherein in each grating filter line in the first direction and in the second direction, the first filter is disposed at a position on a diagonal line of the rectangular pattern.

8. The color imaging element according to claim 4, wherein in each grating filter line in the first direction and in the second direction, the first filter is disposed at a position on a diagonal line of the rectangular pattern.

9. The color imaging element according to claim 1, wherein the M×N of the basic array pattern is 8×6, the basic array pattern has four rectangular patterns, and each of the grating filter line in the first direction and the grating filter line in the second direction is 1 pixel wide.

10. The color imaging element according to claim 2, wherein the M×N of the basic array pattern is 8×6, the basic array pattern has four rectangular patterns, and each of the grating filter line in the first direction and the grating filter line in the second direction is 1 pixel wide.

11. The color imaging element according to claim 3, wherein the M×N of the basic array pattern is 8×6, the basic array pattern has four rectangular patterns, and each of the grating filter line in the first direction and the grating filter line in the second direction is 1 pixel wide.

12. The color imaging element according to claim 4, wherein the M×N of the basic array pattern is 8×6, the basic array pattern has four rectangular patterns, and each of the grating filter line in the first direction and the grating filter line in the second direction is 1 pixel wide.

13. The color imaging element according to claim 1, wherein in the basic array pattern, the grating filter line in the first direction and the grating filter line in the second direction have the same abundance ratio of filters of each color of the second colors.

14. The color imaging element according to claim 1, wherein at least one filter of each color of the second colors is disposed adjacent to each side of the four sides of the rectangular pattern.

15. The color imaging element according to claim 1, wherein in the array of the color filters, one or more of the second filters each corresponding to each color of the second colors are placed in each filter line in the third direction and in the fourth direction.

16. The color imaging element according to claim 1, wherein in a case where the color filter is square, the third direction and the fourth direction are inclined by 45° with respect to the first direction and the second direction respectively.

17. The color imaging element according to claim 1, wherein the first color includes at least any of green and transparent.

18. The color imaging element according to claim 1, wherein the second color includes red and blue.

19. An imaging device comprising
an imaging optical system,
a color imaging element forming a subject image through the imaging optical system, and
an image data generation unit generating image data representing the formed subject image, wherein
the color imaging element is the color imaging element according to claim 1.

* * * * *